US012635281B2

(12) United States Patent
Okazaki

(10) Patent No.: US 12,635,281 B2
(45) Date of Patent: May 19, 2026

(54) IMAGING ELEMENT AND IMAGING DEVICE

(71) Applicant: Sony Semiconductor Solutions Corporation, Kanagawa (JP)

(72) Inventor: Tetsushi Okazaki, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 358 days.

(21) Appl. No.: 18/264,724

(22) PCT Filed: Jan. 27, 2022

(86) PCT No.: PCT/JP2022/002999
§ 371 (c)(1),
(2) Date: Aug. 8, 2023

(87) PCT Pub. No.: WO2022/201839
PCT Pub. Date: Sep. 29, 2022

(65) Prior Publication Data
US 2024/0113148 A1 Apr. 4, 2024

(30) Foreign Application Priority Data

Mar. 24, 2021 (JP) ................................. 2021-050710

(51) Int. Cl.
*H10F 39/00* (2025.01)
(52) U.S. Cl.
CPC ....... *H10F 39/812* (2025.01); *H10F 39/8063* (2025.01); *H10F 39/807* (2025.01)
(58) Field of Classification Search
None
See application file for complete search history.

(56) References Cited

U.S. PATENT DOCUMENTS

| | | | |
|---|---|---|---|
| 2015/0002713 A1* | 1/2015 | Nomura ................ | H10F 39/807 |
| | | | 348/302 |
| 2022/0271069 A1* | 8/2022 | Fukui .................. | H10F 39/8037 |

FOREIGN PATENT DOCUMENTS

| | | |
|---|---|---|
| JP | 2013041890 A | 2/2013 |
| JP | 2013161868 A | 8/2013 |

(Continued)

OTHER PUBLICATIONS

International Search Report (PCT/ISA/210), International Application No. PCT/JP2022/002999, dated Apr. 19, 2022.

*Primary Examiner* — Nishath Yasmeen

(74) *Attorney, Agent, or Firm* — Michael Best & Friedrich LLP

(57) ABSTRACT

Imaging elements and devices that maintain the linearity of image signals with respect to the amount of incident light are disclosed. In one example, an imaging element includes a pixel, a photoelectric conversion unit connecting unit, a charge holding unit, charge transfer units, an image signal generating unit. The pixel includes photoelectric conversion units formed on a semiconductor substrate, the semiconductor substrate including a wiring region disposed on a front surface side, the photoelectric conversion units performing photoelectric conversion of incident light from an object to generate charges. The photoelectric conversion unit connecting unit connects photoelectric conversion units to each other. The of charge transfer units transfer the charges generated by the photoelectric conversion units to the charge holding unit. The image signal generating unit generates an image signal based on the held charges.

20 Claims, 20 Drawing Sheets

1 IMAGING ELEMENT

13 PIXEL DRIVE WIRING
3 PIXEL REGION    100 PIXEL
4
12
INPUT/OUTPUT TERMINAL
VERTICAL DRIVE CIRCUIT
9 VERTICAL SIGNAL LINE
INPUT/OUTPUT TERMINAL
~12
5 COLUMN SIGNAL PROCESSING CIRCUIT
8 CONTROL CIRCUIT
10 HORIZONTAL SIGNAL LINE
HORIZONTAL DRIVE CIRCUIT
6
OUTPUT CIRCUIT
7
11 SUBSTRATE

(56)  References Cited

FOREIGN PATENT DOCUMENTS

| | | | |
|---|---|---|---|
| JP | 2014112580 A | 6/2014 | |
| JP | 2014525673 A | 9/2014 | |
| JP | 2015012127 A | 1/2015 | |
| JP | 2016052041 A | 4/2016 | |
| JP | 2020141146 A | 9/2020 | |
| WO | 2018143306 A1 | 8/2018 | |
| WO | WO-2020241717 A1 * | 12/2020 | ........... H04N 25/778 |

* cited by examiner

FIG.18

IMAGING ELEMENT AND IMAGING DEVICE

FIELD

The present disclosure relates to an imaging element and an imaging device.

BACKGROUND

An imaging element including a pixel in which an on-chip lens (microlens) is disposed, the on-chip lens being shared by a plurality of photoelectric conversion units, has been used (see Patent Literature 1, for example). In this imaging element, a plurality of photoelectric conversion units are divided into two, and image signals based on the divided photoelectric conversion units are respectively generated, whereby an image plane phase difference in which pupil division is performed on an image of an object can be detected. This image plane phase difference enables detection of the focal position of the object. In addition, in this conventional technology, an imaging mode for generating a plurality of image signals based on charges individually generated by the plurality of photoelectric conversion units and an imaging mode for generating a single image signal based on the sum of the charges of the plurality of photoelectric conversion units can be used.

The on-chip lens to be shared by the plurality of photoelectric conversion units may be disposed to be shifted with respect to the plurality of photoelectric conversion units because of variations in production processes or the like. In this case, a difference in the amount of incident light is made between the plurality of photoelectric conversion units, and a difference in sensitivity is made between pixels. A high-sensitivity photoelectric conversion unit has charges with a saturation charge amount in a relatively short time. Here, the saturation charge amount is a charge amount that can be accumulated in the photoelectric conversion unit in an exposure period. When the charges of the photoelectric conversion unit reach the saturation charge amount, the charges overflow from the photoelectric conversion unit. The charges overflowed from the photoelectric conversion unit are typically discharged outside the pixel.

CITATION LIST

Patent Literature

Patent Literature 1: JP 2016-052041 A

SUMMARY

Technical Problem

However, in the above-described conventional technology, when the charges in any of the plurality of photoelectric conversion units reach the saturation charge amount in the imaging mode for generating a single image signal based on the sum of the charges of the plurality of photoelectric conversion units, the charges generated by the photoelectric conversion unit are not reflected in generation of subsequent image signals. This causes a problem that the linearity of image signals with respect to the amount of incident light decreases.

The present disclosure proposes an imaging element and an imaging device that maintain linearity of image signals with respect to the amount of incident light in the imaging element in which an on-chip lens is commonly disposed for a plurality of photoelectric conversion units.

Solution to Problem

An imaging element according to the present disclosure includes: a pixel including a plurality of photoelectric conversion units formed on a semiconductor substrate, the semiconductor substrate including a wiring region disposed on a front surface side, the photoelectric conversion units performing photoelectric conversion of incident light from an object to generate charges; a photoelectric conversion unit connecting unit that connects the plurality of photoelectric conversion units to each other; a charge holding unit that holds the charges generated by the photoelectric conversion units; a plurality of charge transfer units that are individually disposed for the plurality of photoelectric conversion units and transfer the charges generated by the photoelectric conversion units to the charge holding unit to cause the charge holding unit to hold the charges; an image signal generating unit that generates an image signal based on the charges held by the charge holding unit; and an on-chip lens that is disposed in the pixel and collects the incident light to the plurality of photoelectric conversion units in common.

3

Figure 13A:
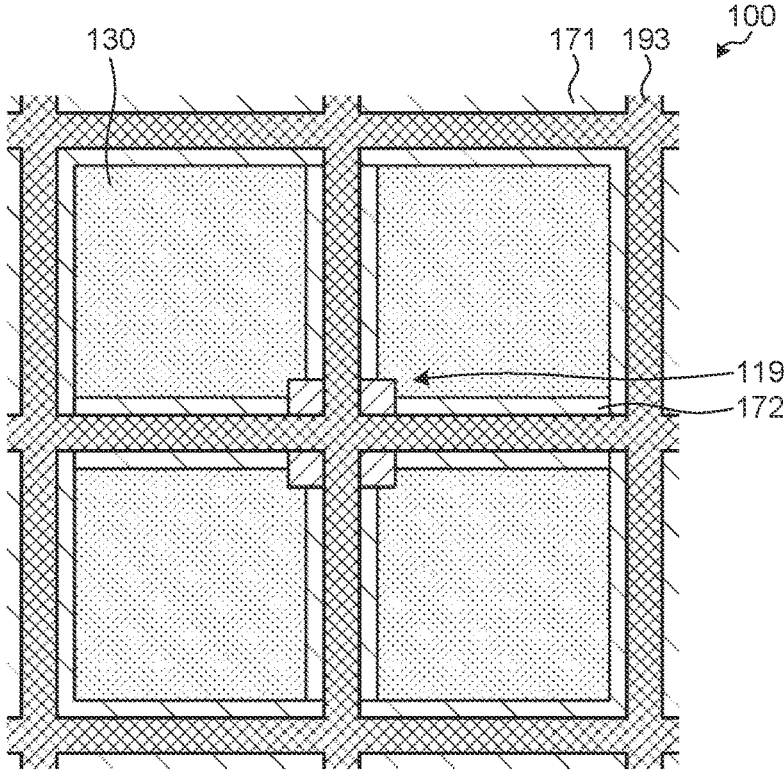
FIG. 13A is a plan view depicting a configuration example of the pixel according to the sixth embodiment of the present disclosure.
Figure 13B:
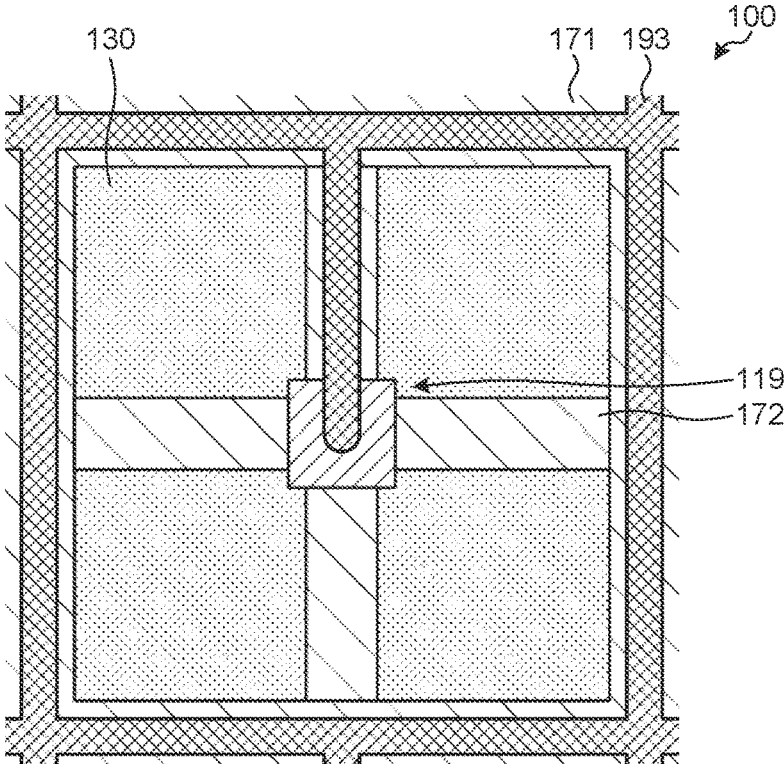

FIG. 13B is a plan view depicting a configuration example of the pixel according to the sixth embodiment of the present disclosure.

Figure 13C:
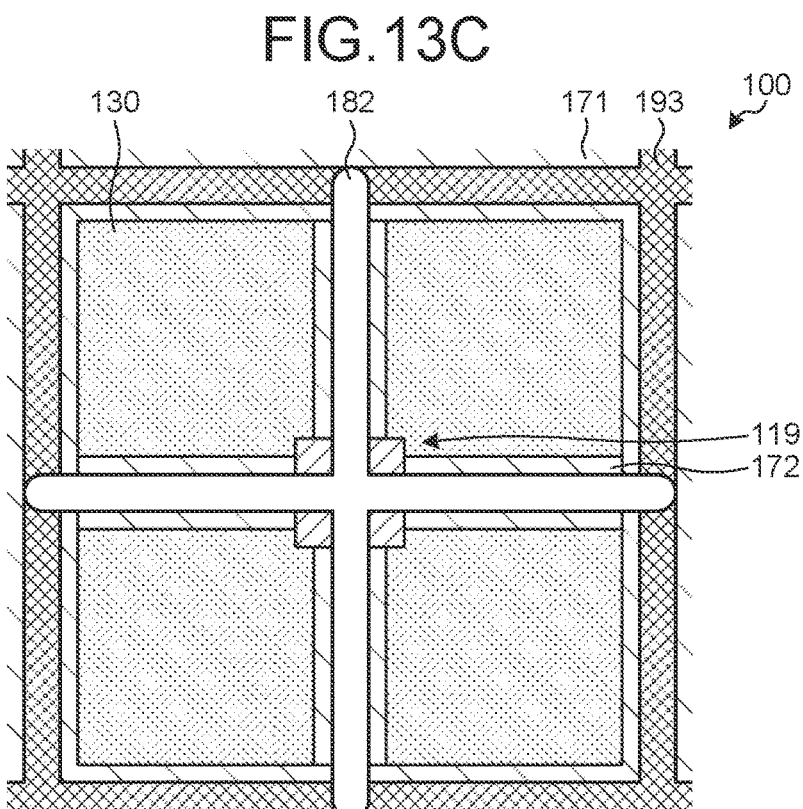

FIG. 13C is a plan view depicting a configuration example of the pixel according to the sixth embodiment of the present disclosure.

Figure 13D:
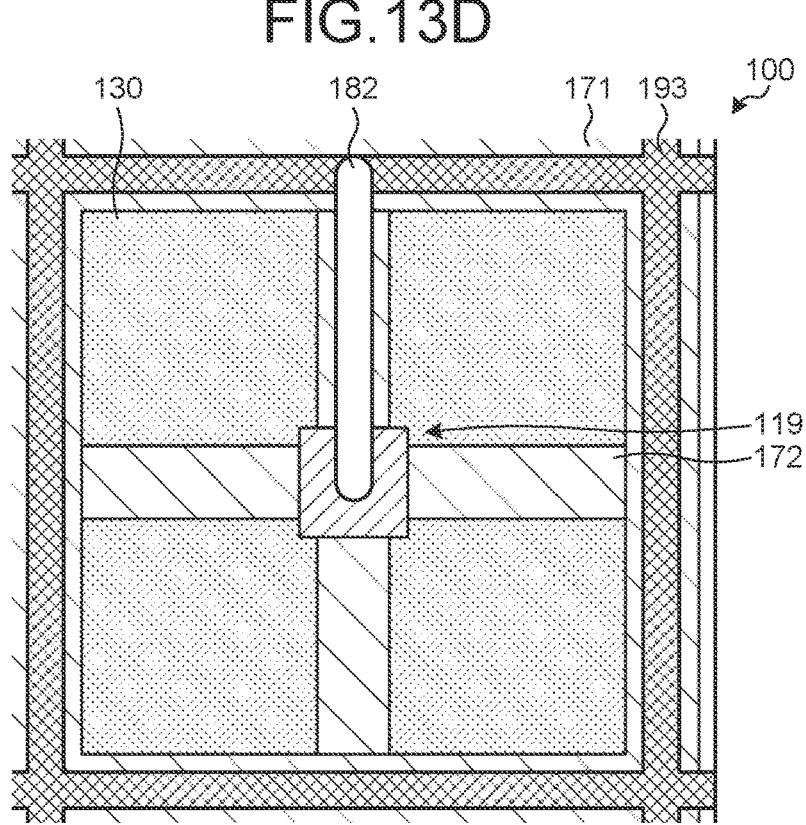

FIG. 13D is a plan view depicting a configuration example of the pixel according to the sixth embodiment of the present disclosure.

Figure 14:
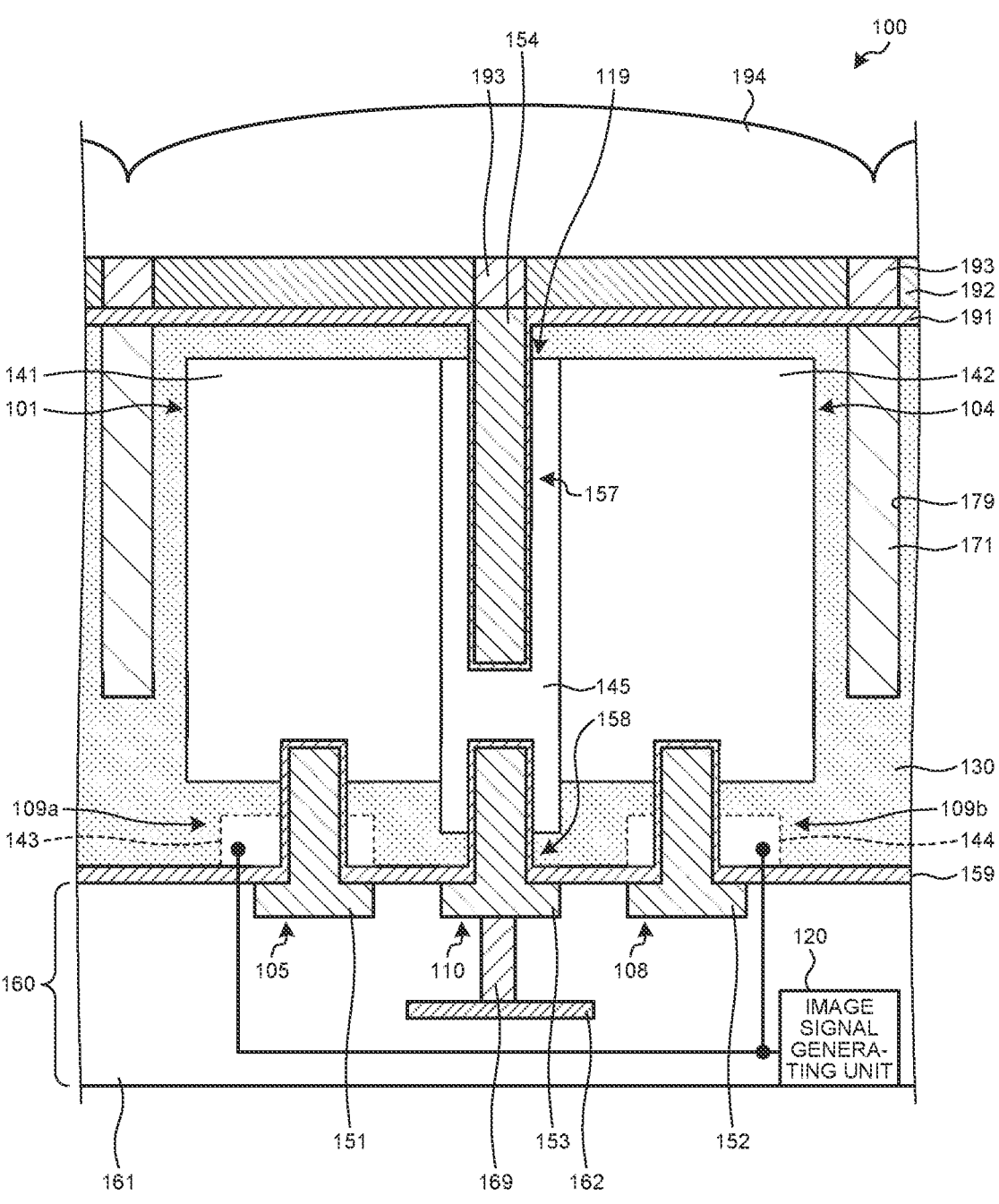

FIG. 14 is a sectional view depicting a configuration example of a pixel according to a seventh embodiment of the present disclosure.

Figure 15:
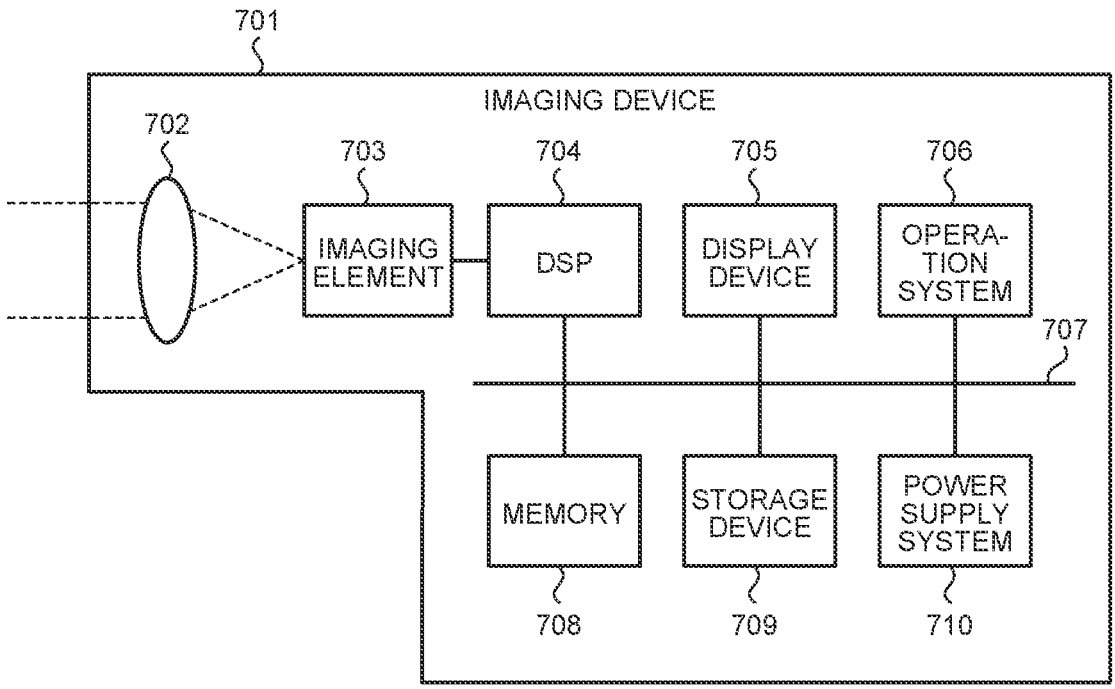

FIG. 15 is a block diagram depicting a configuration example of an imaging device mounted on an electronic device.

Figure 16:
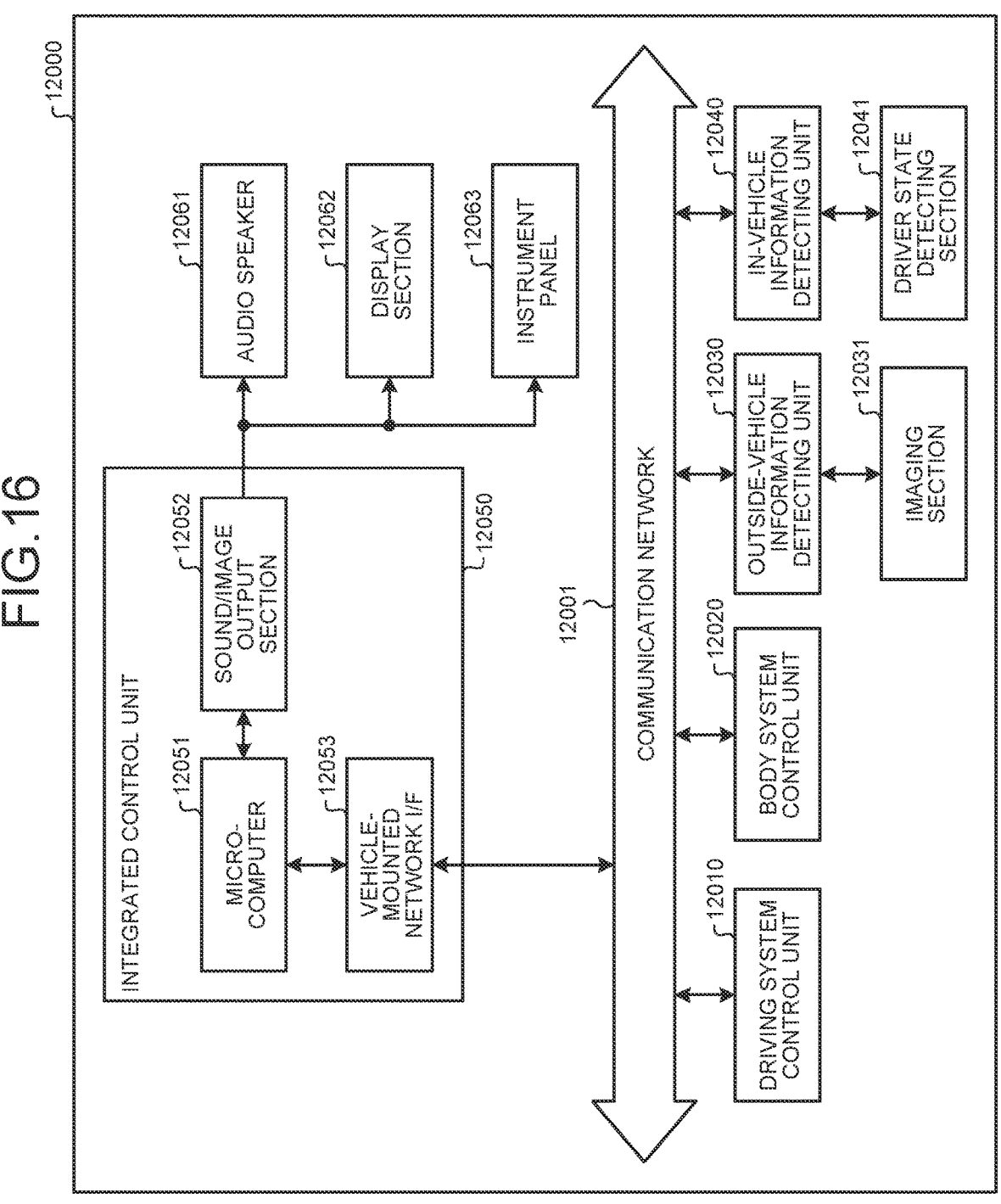

FIG. 16 is a block diagram depicting an example of schematic configuration of a vehicle control system.

Figure 17:
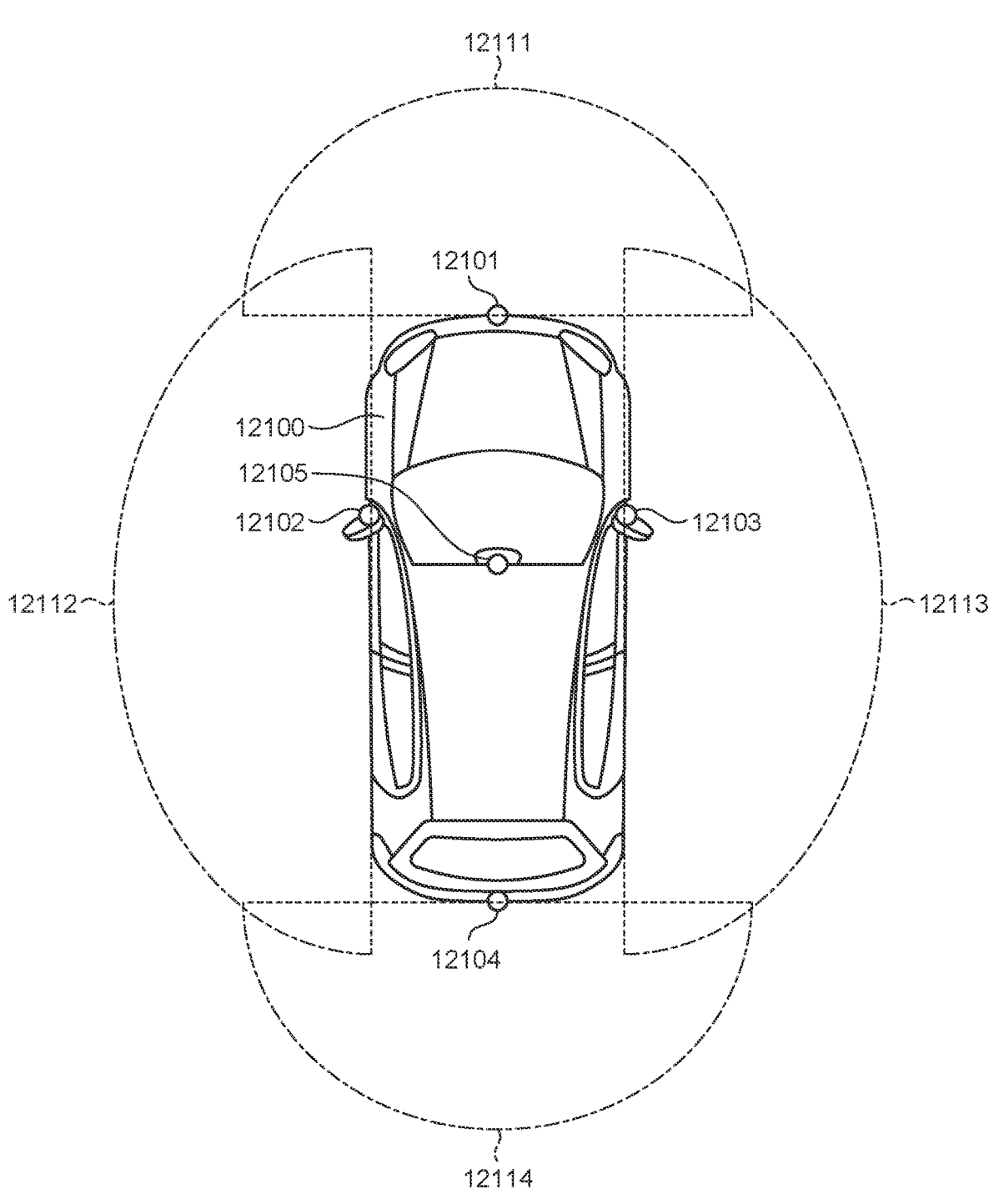

FIG. 17 is a diagram of assistance in explaining an example of installation positions of an outside-vehicle information detecting section and an imaging section.

Figure 18:
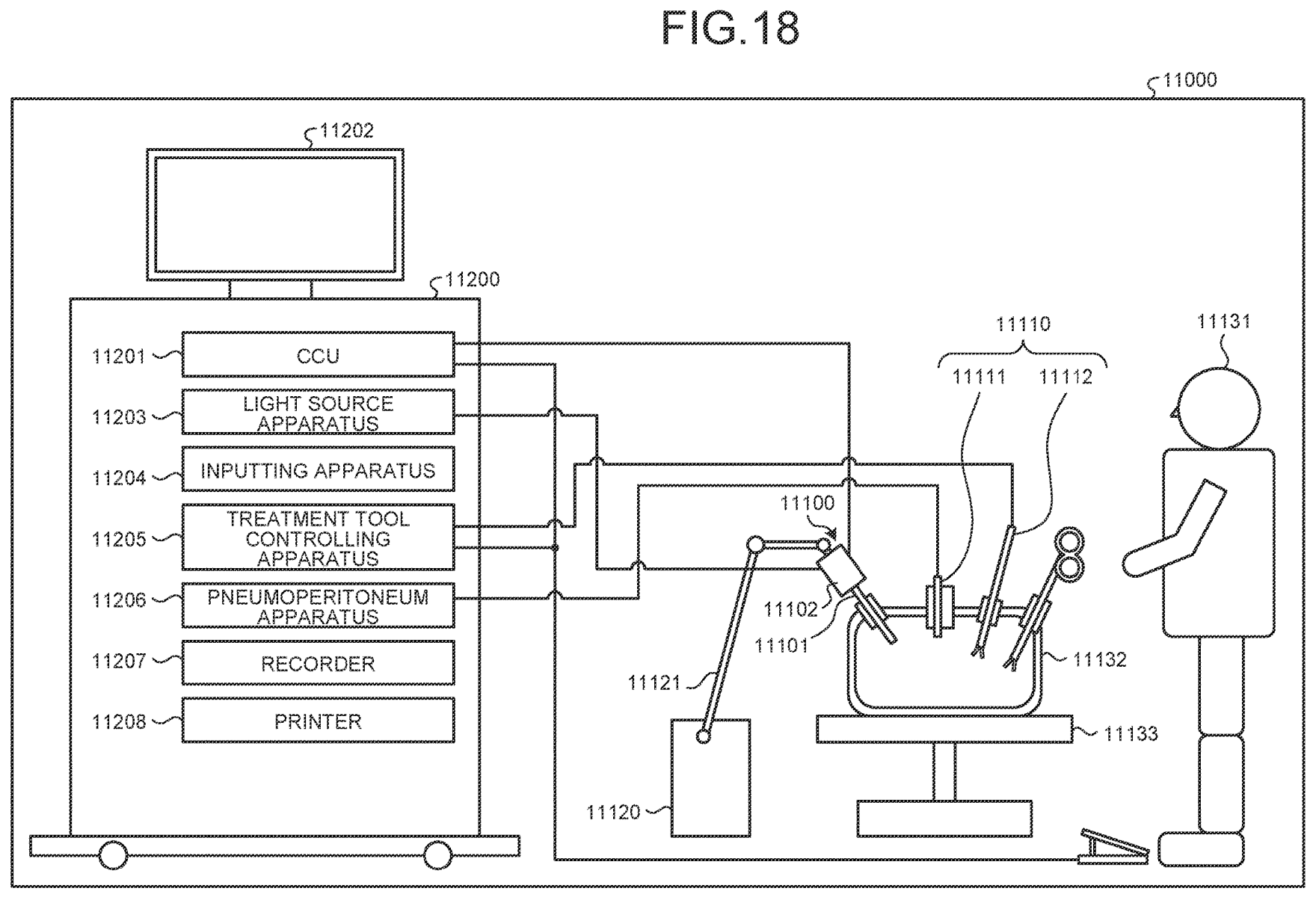

FIG. 18 is a view depicting an example of a schematic configuration of an endoscopic surgery system.

Figure 19:
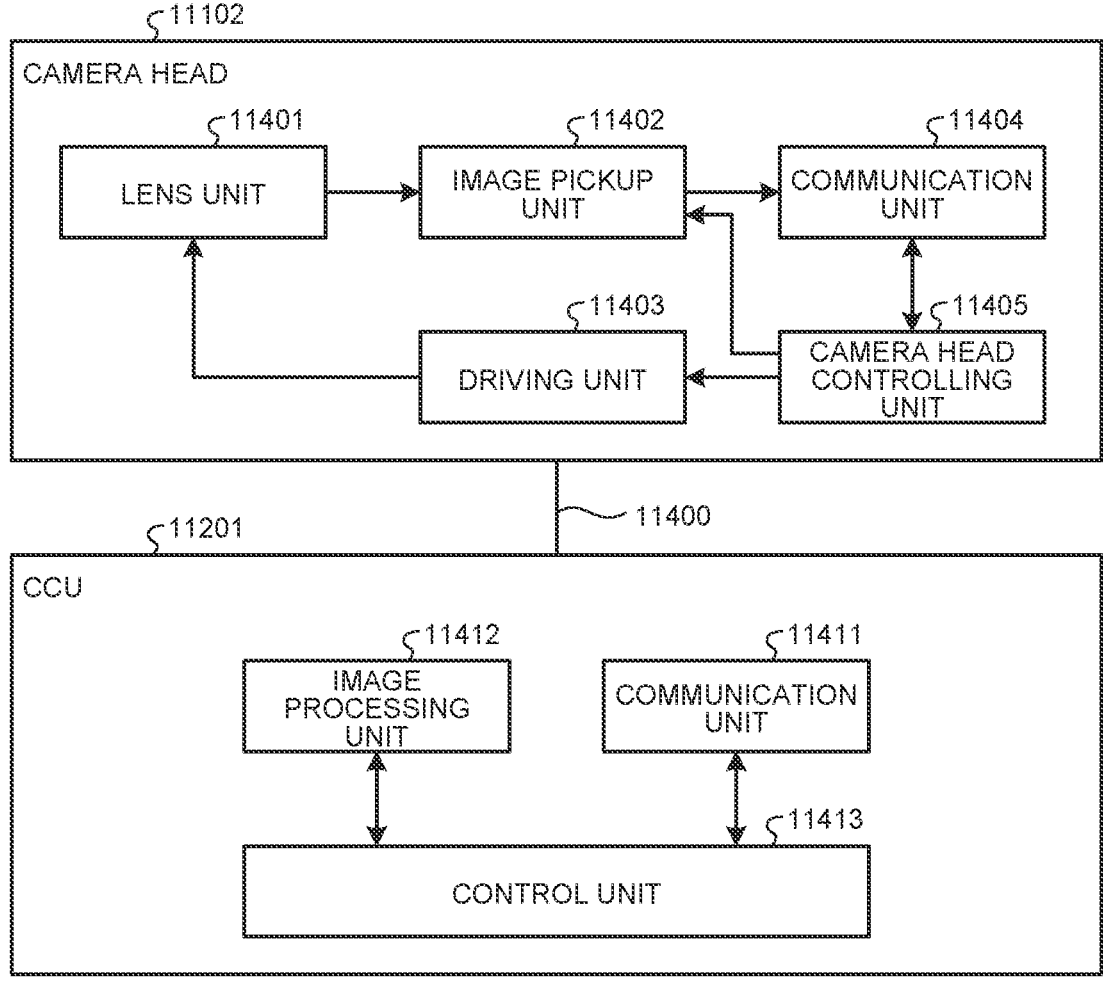

FIG. 19 is a block diagram depicting an example of a functional configuration of a camera head and a camera control unit (CCU).

DESCRIPTION OF EMBODIMENTS

Hereinafter, embodiments of the present disclosure will be described in detail with reference to the drawings. The description will be given in the following order. In each of the following embodiments, the same portions are denoted by the same reference signs, and repetitive description will be omitted.

1. First Embodiment
2. Second Embodiment
3. Third Embodiment
4. Fourth Embodiment
5. Fifth Embodiment
6. Sixth Embodiment
7. Seventh Embodiment
8. Configuration Example of Imaging Device
9. Application Example to Mobile Body
10. Application Example to Endoscopic Surgical System 1. First Embodiment

[Configuration of Imaging Device]

Figure 1:
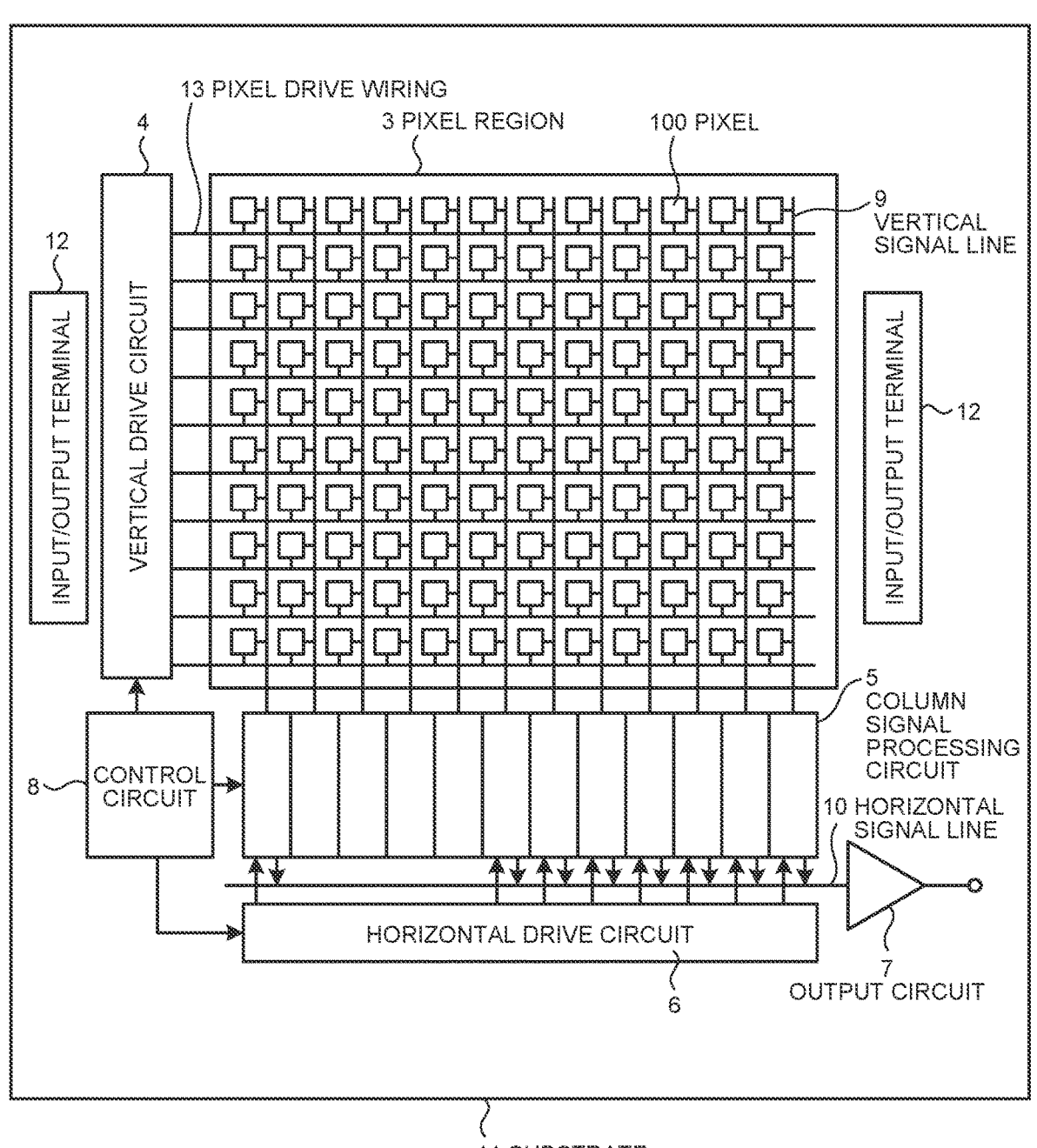
FIG. 1 is a diagram depicting a configuration example of an imaging device according to an embodiment of the present disclosure.

FIG. 1 is a diagram depicting a configuration example of an imaging device according to an embodiment of the present disclosure. As illustrated in FIG. 1, an imaging element 1 of this example includes a pixel region (so-called imaging region) 3 in which pixels 100 including a plurality of photoelectric conversion elements are regularly and two-dimensionally arranged on a semiconductor substrate 11, for example, a silicon substrate, and a peripheral circuit unit. The pixel 100 includes a photoelectric conversion element, for example, a photodiode, and a plurality of pixel transistors (so-called MOS transistors). The plurality of pixel transistors may be formed of, for example, three transistors of a transfer transistor (charge transfer unit described later), a reset transistor, and an amplification transistor. In addition, a selection transistor may be added to form the pixel transistors with four transistors. The pixels 100 may have a share pixel structure. This pixel share structure includes a plurality of photodiodes, a plurality of transfer transistors, one floating diffusion region to be shared, and each of the other pixel transistors to be shared.

The peripheral circuit unit includes a vertical drive circuit 4, a column signal processing circuit 5, a horizontal drive circuit 6, an output circuit 7, and a control circuit 8.

The control circuit 8 receives an input clock and data instructing an operation mode or the like, and it outputs data such as internal information of the imaging device. That is, the control circuit 8 generates a clock signal and a control signal to be a reference of operations of the vertical drive circuit 4, the column signal processing circuit 5, the horizontal drive circuit 6, and the like based on a vertical synchronization signal, a horizontal synchronization signal, and a master clock. These signals are input to the vertical drive circuit 4, the column signal processing circuit 5, the horizontal drive circuit 6, and the like.

The vertical drive circuit 4 is composed of a shift register, for example, and it selects a pixel drive wiring 13, supplies a pulse for driving the pixels to the selected pixel drive wiring, and drives the pixels in units of rows. That is, the vertical drive circuit 4 selectively scans each pixel 100 in the pixel region 3 sequentially in a vertical direction in units of rows, and it supplies a pixel signal based on signal charges generated according to the amount of received light in, for example, a photodiode serving as the photoelectric conversion element of each pixel 100 to the column signal processing circuit 5 through a vertical signal line 9.

The column signal processing circuit 5 is disposed, for example, for each column of the pixels 100, and it performs signal processing such as noise removal on the signals output from the pixels 100 of one row for each pixel column. That is, the column signal processing circuit 5 performs signal processing such as correlated double sampling (CDS) for removing fixed pattern noises unique to the pixel 100, signal amplification, and analog-digital (AD) conversion. A horizontal selection switch (not illustrated) is provided between the output stage of the column signal processing circuit 5 and a horizontal signal line 10.

The horizontal drive circuit 6 is composed of a shift register, for example, and it sequentially selects each column signal processing circuit 5 by sequentially outputting horizontal scanning pulses and causes each column signal processing circuit 5 to output a pixel signal to the horizontal signal line 10.

The output circuit 7 performs signal processing on the signals sequentially supplied from each column signal processing circuit 5 via the horizontal signal line 10, and it outputs the processed signals. For example, the output circuit 7 may perform only buffering or may perform black level adjustment, column variation correction, various digital signal processing, and the like. Input/output terminals 12 exchange signals with the outside.

[Configuration of Pixel]

Figure 2:
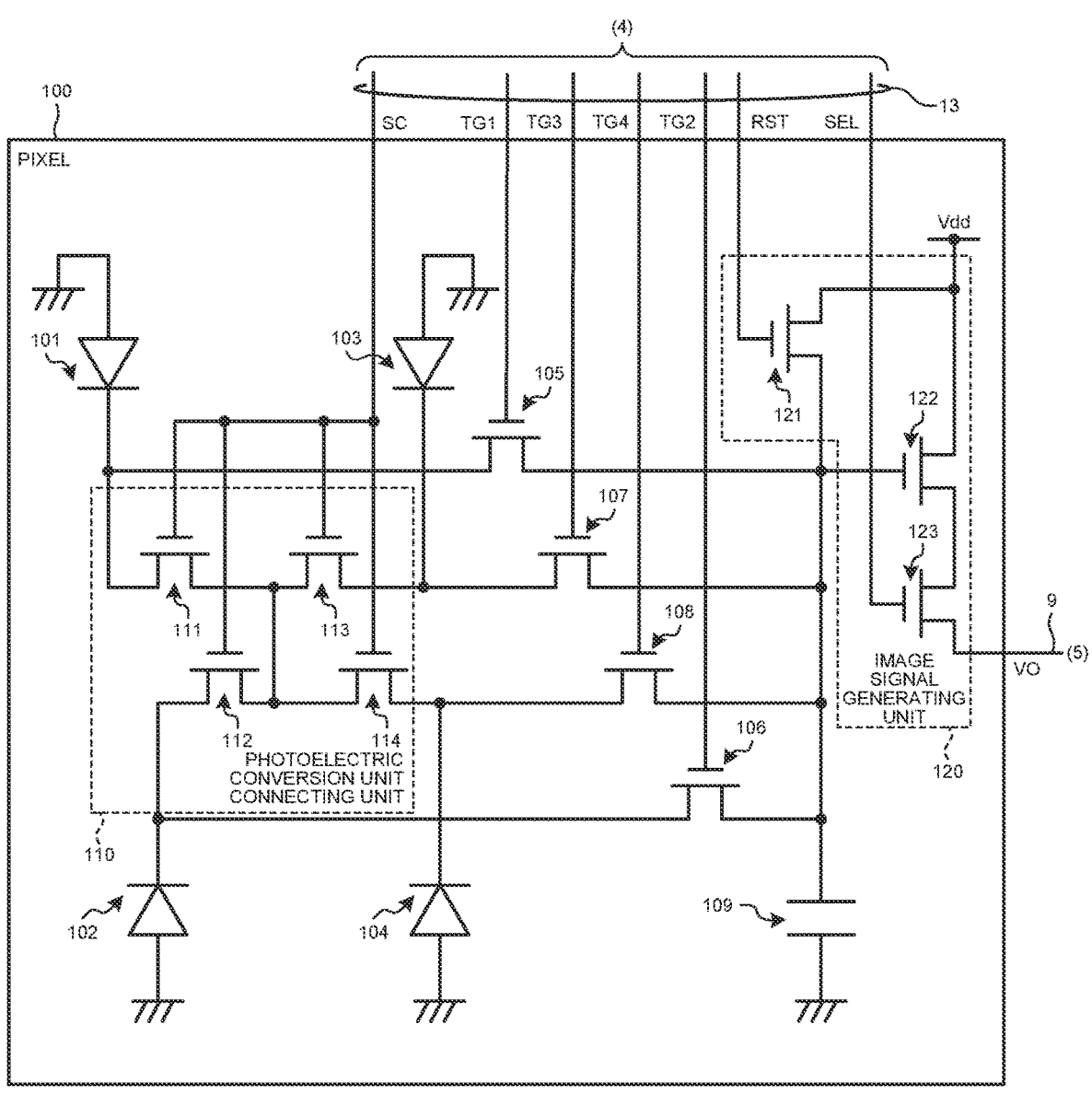
FIG. 2 is a plan view depicting a configuration example of a pixel according to an embodiment of the present disclosure.

FIG. 2 is a plan view depicting a configuration example of a pixel according to an embodiment of the present disclosure. The drawing is a circuit diagram depicting a configuration example of the pixel 100. The pixel 100 in the drawing includes photoelectric conversion units 101 to 104, charge transfer units 105 to 108, a charge holding unit 109, a photoelectric conversion unit connecting unit 110, and an image signal generating unit 120. The photoelectric conversion unit connecting unit 110 is formed of MOS transistors 111 to 114. The image signal generating unit 120 includes a reset transistor 121, an amplification transistor 122, and a selection transistor 123. The photoelectric conversion units 101 to 104 may be composed of photodiodes.

The MOS transistors 111 to 114, the charge transfer units 105 to 108, the reset transistor 121, the amplification transistor 122, and the selection transistor 123 may be composed of n-channel MOS transistors. In these n-channel MOS transistors, the drain and the source may be conducted by applying a voltage exceeding a threshold value of a gate-source voltage Vgs to the gate. Hereinafter, the voltage exceeding the threshold value of the gate-source voltage Vgs is referred to as an ON voltage. A control signal including the ON voltage is referred to as an ON signal. The control signal is transmitted by a signal line TG1 or the like.

As described above, the pixel drive wiring 13 and the vertical signal line 9 are wired to the pixel 100. The pixel drive wiring 13 in the drawing includes a signal line SC, the signal line TG1, a signal line TG2, a signal line TG3, a signal line TG4, a signal line RST, and a signal line SEL. The vertical signal line 9 includes a signal line VO. In addition, a power supply lines Vdd is wired to the pixel 100. The power supply line Vdd is a wiring that supplies power to the pixel 100.

The anode of the photoelectric conversion unit 101 is grounded, and the cathode is connected to the source of the charge transfer unit 105. The anode of the photoelectric conversion unit 102 is grounded, and the cathode is connected to the source of the charge transfer unit 106. The anode of the photoelectric conversion unit 103 is grounded, and the cathode is connected to the source of the charge transfer unit 107. The anode of the photoelectric conversion unit 104 is grounded, and the cathode is connected to the source of the charge transfer unit 108. The drain of the charge transfer unit 105 is connected to the drain of the charge transfer unit 106, the drain of the charge transfer unit 107, the drain of the charge transfer unit 108, the source of the reset transistor 121, the gate of the amplification transistor 122, and one end of the charge holding unit 109. The other end of the charge holding unit 109 is grounded. The drain of the reset transistor 121 and the drain of the amplification transistor 122 are connected to the power supply line Vdd. The source of the amplification transistor 122 is connected to the drain of the selection transistor 123, and the source of the selection transistor 123 is connected to the signal line VO.

The gate of the charge transfer unit 105 is connected to the signal line TG1, and the gate of the charge transfer unit 106 is connected to the signal line TG2. The gate of the charge transfer unit 107 is connected to the signal line TG3, and the gate of the charge transfer unit 108 is connected to the signal line TG4. The gate of the reset transistor 121 is connected to the signal line RST, and the gate of the selection transistor 123 is connected to the signal line SEL.

The cathode of the photoelectric conversion unit 101 is further connected to the source of the MOS transistor 111. The cathode of the photoelectric conversion unit 102 is further connected to the source of the MOS transistor 112. The cathode of the photoelectric conversion unit 103 is further connected to the source of the MOS transistor 113. The cathode of the photoelectric conversion unit 104 is further connected to the source of the MOS transistor 114. The drains of the MOS transistors 111, 112, 113, and 114 are connected to each other. The gates of the MOS transistors 111, 112, 113, and 114 are commonly connected to the signal line SC. For convenience, the drains and the sources of the MOS transistors 111 to 114 have been described separately, but the MOS transistors 111 to 114 are capable of transferring charges bidirectionally without distinguishing between the drains and the sources.

The photoelectric conversion units 101 to 104 perform photoelectric conversion of incident light. The photoelectric conversion units 101 to 104 may be formed of photodiodes formed on a semiconductor substrate 130 described later. The photoelectric conversion units 101 to 104 perform photoelectric conversion of incident light in an exposure period and holds charges generated through photoelectric conversion.

The charge holding unit 109 holds the charges generated by the photoelectric conversion units 101 to 104. The charge holding unit 109 may be formed of a floating diffusion (FD) region which is a semiconductor region formed in the semiconductor substrate 130.

The charge transfer units 105 to 108 transfer charges. The charge transfer unit 105 transfers the charges generated through photoelectric conversion of the photoelectric conversion unit 101 to the charge holding unit 109, and the charge transfer unit 106 transfers the charges generated through the photoelectric conversion of the photoelectric conversion unit 102 to the charge holding unit 109. The charge transfer unit 107 transfers the charges generated through photoelectric conversion of the photoelectric conversion unit 103 to the charge holding unit 109, and the charge transfer unit 108 transfers the charges generated through the photoelectric conversion of the photoelectric conversion unit 104 to the charge holding unit 109. The charge transfer unit 105 and the like transfer charges by electrically connecting the photoelectric conversion unit 101 and the like and the charge holding unit 109. The control signals of the charge transfer units 105 to 108 are transmitted by the signal lines TG1 to TG4, respectively.

The image signal generating unit 120 generates an image signal based on the charges held in the charge holding unit 109. As described above, the image signal generating unit 120 includes the reset transistor 121, the amplification transistor 122, and the selection transistor 123.

The reset transistor 121 resets the charge holding unit 109. This reset may be performed by discharging the charges in the charge holding unit 109 by electrically connecting the charge holding unit 109 and the power supply line Vdd. The control signal of the reset transistor 121 is transmitted by the signal line RST.

The amplification transistor 122 amplifies the voltage of the charge holding unit 109. The gate of the amplification transistor 122 is connected to the charge holding unit 109. Thus, an image signal with a voltage corresponding to the charges held in the charge holding unit 109 is generated in the source of the amplification transistor 122. Making the selection transistor 123 conductive enables this image signal to be output to the signal line VO. The control signal of the selection transistor 123 is transmitted by the signal line SEL.

The photoelectric conversion units 101 to 104 perform photoelectric conversion of incident light in an exposure period to generate charges and accumulates the charges in themselves. After the lapse of the exposure period, the charges of the photoelectric conversion units 101 to 104 are transferred to the charge holding unit 109 by the charge transfer units 105 to 108 and held by the charge holding unit 109. The image signal generating unit 120 generates an image signal based on the held charges.

The charge transfer units 105 to 108 can perform collective transfer in which the charges generated by the photoelectric conversion units 101 to 104 are commonly transferred to the charge holding unit 109 and the charges generated by the photoelectric conversion units 101 to 104 are simultaneously and collectively held in the charge holding unit 109. In this case, the image signal generating unit 120 generates an image signal based on charges obtained by summing up the charges generated by the photoelectric conversion units 101 to 104. The charge transfer units 105 to 108 also perform individual transfer of individually transferring the charges generated by the photoelectric conversion units 101 to 104 to the charge holding unit 109. In this case, the image signal generating unit 120 generates an image signal every time the charges of the photoelectric conversion units 101 to 104 are transferred to the charge holding unit 109. As a result, four image signals corresponding to the photoelectric conversion units 101 to 104 are generated.

The photoelectric conversion unit connecting unit 110 connects the photoelectric conversion units 101 to 104 to each other. As described later, the photoelectric conversion unit connecting unit 110 may be formed of a single element. For convenience, the operation of the photoelectric conversion unit connecting unit 110 will be described using the circuit of the MOS transistors 111 to 114. When the ON voltage is applied from the signal line SC to the gates of the MOS transistors 111 to 114, the MOS transistors 111 to 114 are brought into a conductive state. This connects the cathodes of the photoelectric conversion units 101 to 104 to each other. Then, the charges accumulated in the photoelectric conversion units 101 to 104 are evenly distributed to the photoelectric conversion units 101 to 104. Even when the amounts of charges generated through photoelectric conversion in the photoelectric conversion units 101 to 104 are different from each other, the amounts of charges held in the photoelectric conversion units 101 to 104 can be equalized.

The connection of the photoelectric conversion units 101 to 104 to each other with the photoelectric conversion unit connecting unit 110 is preferably performed when charges to be collectively transferred by the charge transfer units 105 to 108 are generated. This is because overflow of the charges can be prevented even when the photoelectric conversion units 101 to 104 have different sensitivities and the accumulated charges in some of the photoelectric conversion units 101 to 104 reach a saturation charge amount.

[Configuration of Plane of Pixel]

Figure 3:
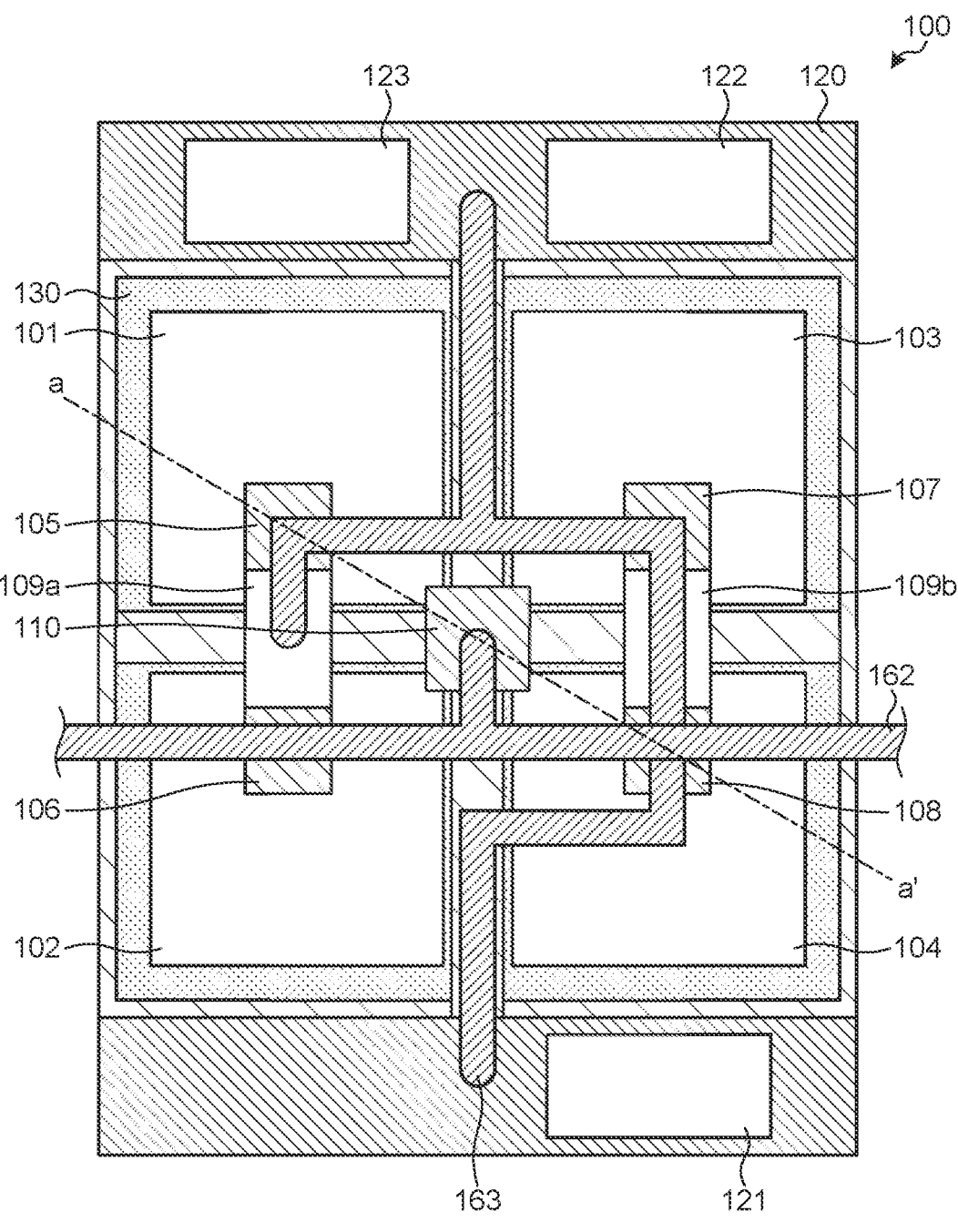
FIG. 3 is a plan view depicting a configuration example of a pixel according to a first embodiment of the present disclosure.

FIG. 3 is a plan view depicting a configuration example of a pixel according to a first embodiment of the present disclosure. The drawing is a plan view depicting a configuration example of the pixel 100. In the pixel 100 in the drawing, the photoelectric conversion units 101 to 104 are disposed in two rows and two columns. As described later, the photoelectric conversion units 101 to 104 in the drawing represent the semiconductor region formed on the semiconductor substrate 130. The charge transfer units 105 to 108 are disposed at positions overlapping the photoelectric conversion units 101 to 104, respectively. As described later, the charge transfer units 105 to 108 in the drawing represent gate electrodes of individual MOS transistors. The charge holding unit 109 is disposed adjacent to the charge transfer units 105 to 108. In the pixel 100 in the drawing, charge holding units 109a and 109b are disposed. The charge holding unit 109a is disposed between the charge transfer units 105 and 106, and the charge holding unit 109b is disposed between the charge transfer units 107 and 108. These charge holding units 109a and 109b are connected by a wiring 163 to be described later. The wiring 163 is a wiring that connects the charge holding units 109a and 109b and the image signal generating unit 120.

The photoelectric conversion unit connecting unit 110 is disposed at the central part of the pixel 100. The photoelectric conversion unit connecting unit 110 is formed in a shape adjacent to each of the photoelectric conversion units 101 to 104. As described later, the photoelectric conversion unit connecting unit 110 in the drawing represents a gate electrode. A wiring 162 is connected to the gate electrode of the photoelectric conversion unit connecting unit 110. The wiring 162 is a wiring corresponding to the signal line SC described in FIG. 2. The image signal generating unit 120 is divided and disposed on the upper side and the lower side of the pixel 100. A circuit of the amplification transistor 122 and the selection transistor 123 is disposed in the image signal generating unit 120 on the upper side of the pixel 100, and a circuit of the reset transistor 121 is disposed in the image signal generating unit 120 on the lower side of the pixel 100.

A pixel isolation unit 171 described later is disposed at a boundary of the pixel 100. An in-pixel isolation unit 172 described later is disposed between the photoelectric conversion units 101 to 104 in the pixel 100.

[Configuration of Section of Pixel]

Figure 4:
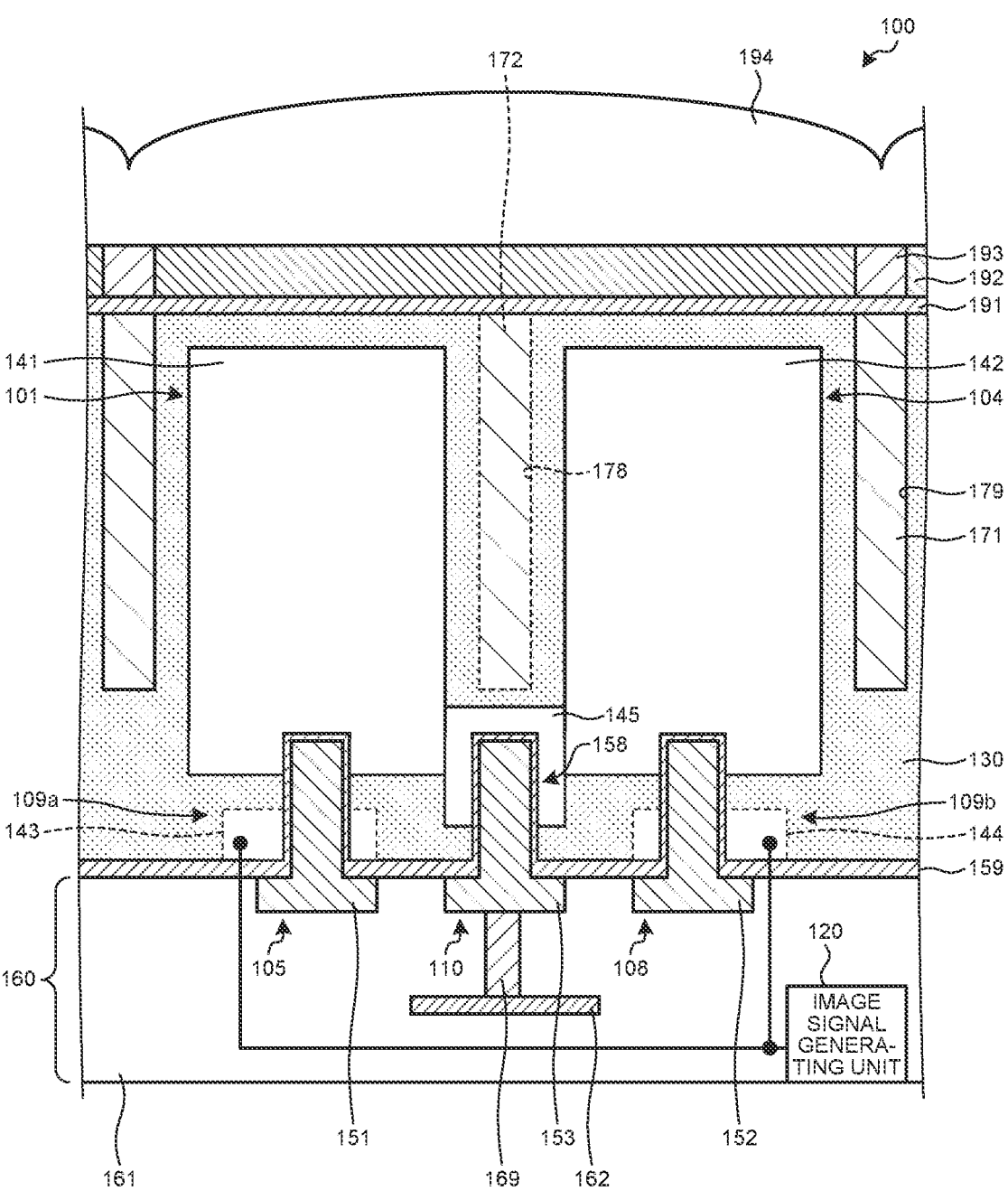
FIG. 4 is a sectional view depicting a configuration example of the pixel according to the first embodiment of the present disclosure.

FIG. 4 is a sectional view depicting a configuration example of the pixel according to the first embodiment of the present disclosure. The drawing is a sectional view depicting a configuration example of the pixel 100 taken along line a-a' in FIG. 3. The pixel 100 in the drawing includes a semiconductor substrate 130, an insulating film 159, a wiring region 160, the pixel isolation unit 171, the in-pixel isolation unit 172, an insulating film 191, a color filter 192, a light shielding film 193, and an on-chip lens 194. The image signal generating unit 120 is further illustrated in the drawing.

The semiconductor substrate 130 is a semiconductor substrate on which a diffusion layer of the elements of the pixel 100 is disposed. The semiconductor substrate 130 may be made of silicon (Si), for example. The elements such as the photoelectric conversion unit 101 may be disposed in a well region formed in the semiconductor substrate 130. For convenience, the semiconductor substrate 130 in the drawing is assumed to be formed in a p-type well region. The diffusion layer of the elements may be formed by disposing an n-type or p-type semiconductor region in the well region. In the drawing, the photoelectric conversion units 101 and 104, the charge transfer units 105 and 108, the charge holding units 109a and 109b, and the photoelectric conversion unit connecting unit 110 are illustrated.

The photoelectric conversion unit 101 is formed of an n-type semiconductor region 141. Specifically, a photodiode with a p-n junction at an interface between the n-type semiconductor region 141 and a surrounding p-type well region corresponds to the photoelectric conversion unit 101. Similarly, the photoelectric conversion unit 104 is formed of an n-type semiconductor region 142. Charges generated through photoelectric conversion of the photoelectric conversion units 101 and 104 in an exposure period are accumulated in the n-type semiconductor regions 141 and 142. In addition, n-type semiconductor regions 143 and 144 constituting the charge holding units 109a and 109b are disposed on the front surface side of the semiconductor substrate 130.

The in-pixel isolation unit 172 is disposed between the photoelectric conversion units 101 and 104. The in-pixel isolation unit 172 electrically isolates the n-type semiconductor regions 141 and 142 constituting the photoelectric conversion units 101 and 104. The in-pixel isolation unit 172 may be formed of, for example, an insulating member embedded in a groove 178 formed in the semiconductor substrate 130. Silicon oxide ($SiO_2$) may be used for the insulating member. The groove 178 is a groove formed from the back surface side of the semiconductor substrate 130 and is a groove having a depth with which the bottom of the groove reaches the vicinity of the front surface of the semiconductor substrate 130.

The pixel isolation unit 171 is disposed at the boundary of the pixel 100 of the semiconductor substrate 130. The pixel isolation unit 171 electrically isolates adjacent pixels 100 from each other. The pixel isolation unit 171 may be formed of, for example, an insulating member embedded in a groove 179 formed in the semiconductor substrate 130. $SiO_2$ may be used for the insulating member. Similarly to the groove 178, the groove 179 is a groove formed from the back surface side of the semiconductor substrate 130 and is a groove having a depth with which the bottom of the groove reaches the vicinity of the front surface of the semiconductor substrate 130.

The insulating film 159 is a film that insulates the front surface side of the semiconductor substrate 130. The insulating film 159 may be made of $SiO_2$ or silicon nitride (SiN).

Gate electrodes 151 and 152 are disposed on the front surface side of the semiconductor substrate 130. The gate electrodes 151 and 152 constitute the gates of the charge transfer units 105 and 108, respectively. The gate electrodes 151 and 152 are partially embedded in the semiconductor substrate 130. The gate electrode 151 is configured to have a bottom adjacent to the n-type semiconductor region 141 constituting the photoelectric conversion unit 101 and is configured to have a side adjacent to the n-type semiconductor region 143 constituting the charge holding unit 109a. When the ON voltage is applied to the gate electrode 151, a channel is formed in the semiconductor substrate 130 near the gate electrode 151. This channel brings the photoelectric conversion unit 101 and the charge holding unit 109a into a conductive state, and charges can be transferred. In this manner, the charge transfer unit 105 transfers charges in a thickness direction of the semiconductor substrate 130.

Similarly to the gate electrode 151, the gate electrode 152 is partially embedded in the semiconductor substrate 130. The gate electrodes 151 and 152 may be made of polycrystalline silicon. The insulating film 159 between the gate electrodes 151 and 152 and the semiconductor substrate 130 constitutes a gate insulating film. The charge holding units 109a and 109b are commonly connected to an input of the image signal generating unit 120.

The wiring region 160 is a region disposed on the front surface side of the semiconductor substrate 130. Wiring and the like of the pixel 100 are disposed in the wiring region 160. The wiring region 160 includes the wiring 162 and an insulating layer 161. The wiring 162 transmits a signal or the like of the pixel 100. The wiring 162 may be made of a conductor, such as copper (Cu) or tungsten (W). The insulating layer 161 insulates the wiring 162 and the like. The insulating layer 161 may be made of $SiO_2$, for example. The wiring 162 in the drawing represents wiring connected to a gate electrode 153 described later. The wiring 162 and the gate electrode 153 may be connected by a contact plug 169.

The insulating film 191 is a film that insulates the back surface side of the semiconductor substrate 130. The insulating film 191 may be made of $SiO_2$, for example.

The color filter 192 is an optical filter that transmits light having a predetermined wavelength of incident light. For example, color filters that transmit red light, green light, and blue light may be used as the color filter 192.

The light shielding film 193 is disposed at the boundary of the pixel 100 to shield incident light. The light shielding film 193 may be made of tungsten. Disposing the light shielding film 193 can shield light obliquely incident from adjacent pixels 100.

The on-chip lens 194 is a lens that collects incident light. The on-chip lens 194 is formed in a hemispherical shape and collects incident light to the photoelectric conversion units 101 and 102.

The imaging element 1 in the drawing is a back-illuminated imaging element in which the photoelectric conversion unit 101 and the like are irradiated with incident light from the back surface side of the semiconductor substrate 130.

The photoelectric conversion unit connecting unit 110 is formed of a semiconductor region 145 and the gate electrode 153. The semiconductor region 145 is disposed in the vicinity of the front surface side of the semiconductor substrate 130 at the center of the pixel 100. The semiconductor region 145 is a semiconductor region adjacent to the semiconductor regions 141 and 142 constituting the photoelectric conversion units 101 and 104. The semiconductor region 145 is configured to have a conductivity type different from those of the semiconductor regions 141 and 142. The semiconductor region 145 in the drawing may be configured as a p-type. The gate electrode 153 is partially embedded in the semiconductor substrate 130 and has a bottom and a side adjacent to the semiconductor region 145. The gate electrode 153 may be formed by forming an opening 158 on the front surface side of the semiconductor substrate 130 and disposing polycrystalline silicon in the opening 158. The insulating film 159 constituting a gate insulating film is also disposed between the gate electrode 153 and the semiconductor substrate 130.

When the ON voltage is applied to the gate electrode 153, a channel is formed in the semiconductor region 145. This channel brings the semiconductor regions 141 and 142 constituting the photoelectric conversion units 101 and 104 into a conductive state. Charges can thus move between the semiconductor regions 141 and 142. When the amount of accumulated charges is different between the semiconductor regions 141 and 142, a concentration gradient of charges is formed. Since charges are diffused according to the concentration gradient, charges move from the semiconductor region in which more charges are accumulated to the other semiconductor region. As a result, the charges accumulated in the photoelectric conversion units 101 to 104 are evenly distributed to the photoelectric conversion units 101 to 104.

In addition, the region of the semiconductor region 145 constituting the photoelectric conversion unit connecting unit 110 can be expanded in the thickness direction of the semiconductor substrate 130 by forming the gate electrode 153 in a shape embedded in the semiconductor substrate 130. It is possible to expand the region where the channel is formed while preventing the area of the photoelectric conversion unit connecting unit 110 in a plane direction of the semiconductor substrate 130 from increasing.

Further, since charges can also be accumulated in the semiconductor region 145 constituting the photoelectric conversion unit connecting unit 110, the saturation charge amount at the time of collective transfer can be increased.

[Pixel Disposition]

Figure 5:
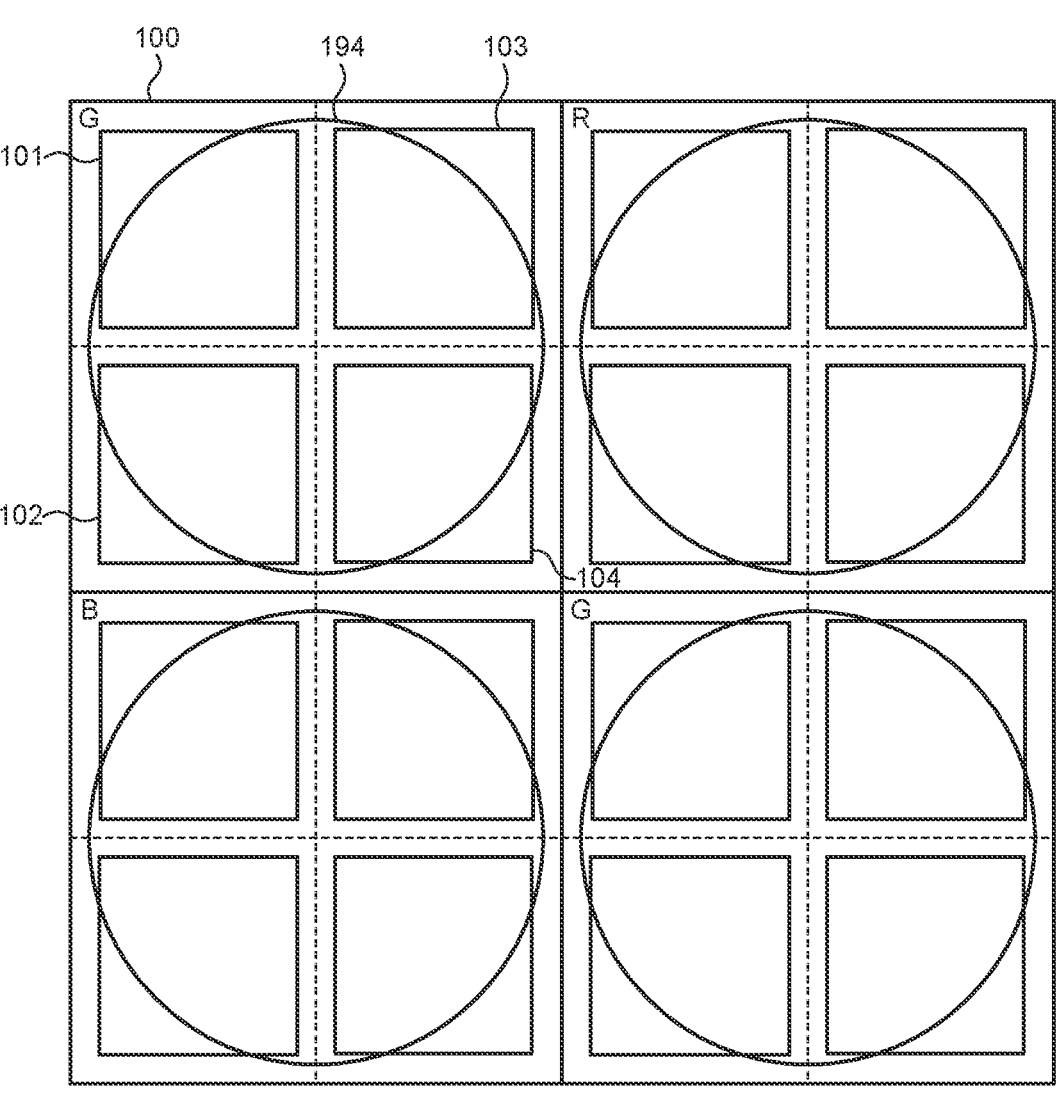
FIG. 5 is a plan view depicting a disposition example of pixels according to an embodiment of the present disclosure.

FIG. 5 is a plan view depicting a disposition example of pixels according to an embodiment of the present disclosure. The drawing is a plan view depicting a disposition example of the pixels 100. The rectangles inside the pixels 100 in the drawing represent the photoelectric conversion units 101 to 104. The circles inside the pixels 100 represent on-chip lenses. "R", "G", and "B" in the drawing represent the types of the color filter 192 disposed in the pixels 100. "R", "G", and "B" represent the color filters 192 that transmit red light, green light, and blue light, respectively. The drawing depicts an example in which the pixels 100 in two rows and two columns are configured in a Bayer array. The pixel region 3 is configured by repeatedly disposing the pixels 100 arrayed in two rows and two columns in the drawing. Illustration of the image signal generating unit 120 is omitted in the drawing.

When an image signal is generated for each of the photoelectric conversion units 101 to 104, charges are individually transferred. When one image signal is generated by summing up the charges generated by the photoelectric conversion units 101 to 104, collective transfer of the charges of the photoelectric conversion units 101 to 104 is performed. Here, a case where the on-chip lens 194 in the drawing is disposed to be shifted from the center of the pixel 100 (intersection of the dotted lines in the drawing) will be considered. Specifically, when the on-chip lens 194 is disposed to be shifted in the right direction in the drawing, incident light to the photoelectric conversion units 103 and 104 increases, and incident light to the photoelectric conversion units 101 and 102 decreases. As a result of the increase in the charge amount of the photoelectric conversion units 103 and 104, the charges in the photoelectric conversion units 103 and 104 reach the saturation charge amount sooner. At this time, by making the photoelectric conversion unit connecting unit 110 conductive, the charges in the photoelectric conversion units 103 and 104 can be moved to the photoelectric conversion units 101 and 102. Overflow of charges in the photoelectric conversion units 103 and 104 can be prevented, and the linearity of image signals can be maintained.

The photoelectric conversion units 101 to 104 may be divided into two groups, and an image signal may be generated for each group. For example, the photoelectric conversion units 101 to 104 may be divided in a lateral direction in the drawing to form a group of the photoelectric conversion units 101 and 102 and a group of the photoelectric conversion units 103 and 104. In this case, the charges generated by the photoelectric conversion units 101 and 102 are summed to generate an image signal, and the charges generated by the photoelectric conversion units 103 and 104 are summed to generate an image signal. Each image signal generated by dividing the photoelectric conversion units of the pixel 100 into two regions (groups) like this is referred to as a phase difference signal. The image plane phase difference of an object image can be detected with the phase difference signal.

An optical system such as an imaging lens is disposed on the object side of the imaging element 1. The photoelectric conversion units 101 and 102 are irradiated with light passing through the right side of the imaging lens, and the photoelectric conversion units 103 and 104 are irradiated with light passing through the left side of the imaging lens. A method of dividing the photoelectric conversion units of the pixel 100 into two regions to generate an image signal from each of the divided regions like this is referred to as pupil division. The focal position of the imaging lens can be detected by detecting the shift of the image configured for each divided phase difference signal. Autofocus can be performed by moving the imaging lens in an optical axis direction based on the detected focal position. The pupil division can also be performed by dividing the photoelectric conversion units 101 to 104 in a longitudinal direction of the drawing.

[Generation of Image Signal]

Figure 6:
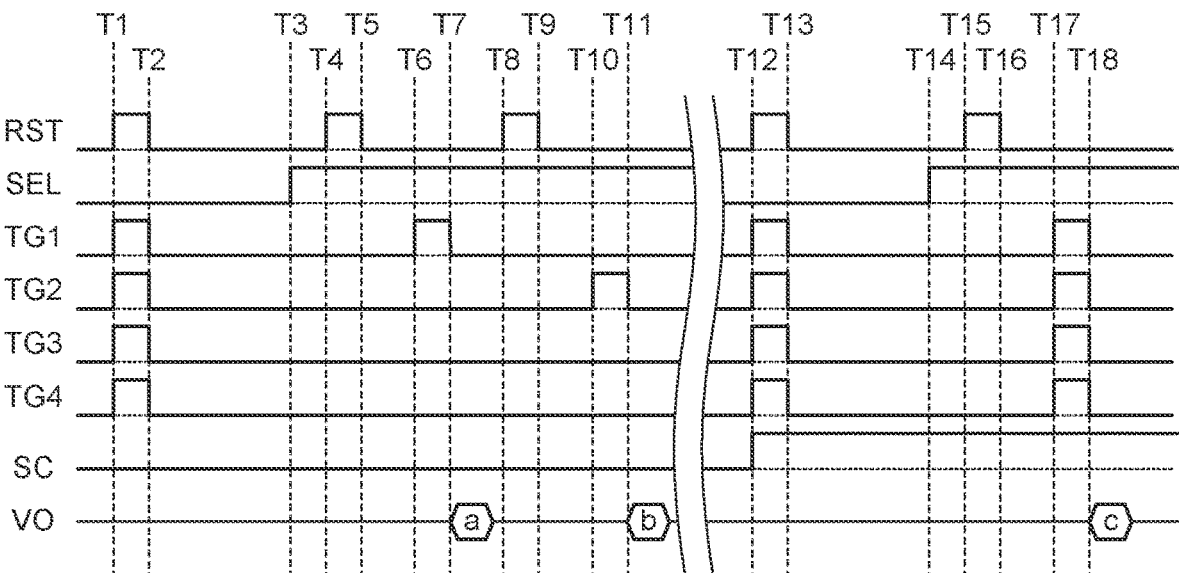
FIG. 6 is a plan view depicting an example of generation of image signals according to an embodiment of the present disclosure.

FIG. 6 is a plan view depicting an example of generation of image signals according to an embodiment of the present disclosure. The drawing is a timing chart depicting an example of generation of image signals. In the drawing, "RST", "SEL", "TG1", "TG2", "TG3", "TG4", and "SC" represent control signals transmitted by the signal line RST, the signal line SEL, the signal line TG1, the signal line TG2, the signal line TG3, the signal line TG4, and the signal line SC, respectively. A portion of the value "1" of these binarized control signals represents a signal of the above-described ON voltage. The broken lines in the drawing represent the level of 0 V. "VO" in the drawing represents an image signal of the signal line VO. The control signal in the drawing represents an example of a control signal for applying a voltage of 0 V when the MOS transistor to be controlled is turned off. a different voltage, for example, −1 V may also be applied to the signal voltage for turning off the MOS transistor.

In the initial state, the value "0" is applied to the signal line RST, the signal line SEL, the signal line TG1, the signal line TG2, the signal line TG3, the signal line TG4, and the signal line SC. The first half (T1 to T11) of the drawing represents generation of image signals through individual transfer, and the second half (T12 to T18) of the drawing represents generation of image signals through collective transfer.

At T1, an ON signal is applied to the signal line RST, the signal line TG1, the signal line TG2, the signal line TG3, and the signal line TG4. This electrically connects the reset transistor 121 and the charge transfer unit 105 to 108 and resets the photoelectric conversion units 101 to 104 and the charge holding unit 109.

At T2, the application of the ON signal to the signal line RST, the signal line TG1, the signal line TG2, the signal line TG3, and the signal line TG4 is stopped. This starts an exposure period and accumulates charges generated through photoelectric conversion in the photoelectric conversion units 101 to 104.

At T3, an ON signal is applied to the signal line SEL. The application of the ON signal to the signal line SEL continues until the output of an image signal based on the charges of the photoelectric conversion units 101 to 104.

At T4, an ON signal is applied to the signal line RST, and the charge holding unit 109 is reset. At T4, the exposure period ends.

At T5, the application of the ON signal to the signal line RST is stopped.

At T6, an ON signal is applied to the signal line TG1. The charge transfer unit 105 is conducted, and the charges accumulated in the photoelectric conversion unit 101 are transferred to the charge holding unit 109.

At T7, the application of the ON signal to the signal line TG1 is stopped. In the period until the next T8, an image signal a corresponding to the charges of the photoelectric conversion unit 101 is output from the signal line VO.

At T8, an ON signal is applied to the signal line RST, and the charge holding unit 109 is reset.

At T9, the application of the ON signal to the signal line RST is stopped.

At T10, an ON signal is applied to the signal line TG2. The charge transfer unit 106 is conducted, and the charges accumulated in the photoelectric conversion unit 102 are transferred to the charge holding unit 109.

At T11, the application of the ON signal to the signal line TG2 is stopped. After that, an image signal b corresponding to the charges of the photoelectric conversion unit 102 is output from the signal line VO.

After that, resetting of the charge holding unit 109 and individual transfer are repeated, and image signals based on the charges accumulated in the photoelectric conversion units 103 and 104 are sequentially generated.

An image signal through individual transfer can be generated in this manner. Next, a mode for generating an image signal through collective transfer of charges will be described.

At T12, an ON signal is applied to the signal line RST, the signal line TG1, the signal line TG2, the signal line TG3, and the signal line TG4. This electrically connects the reset transistor 121 and the charge transfer unit 105 to 108 and resets the photoelectric conversion units 101 to 104 and the charge holding unit 109.

At T13, the application of the ON signal to the signal line RST, the signal line TG1, the signal line TG2, the signal line TG3, and the signal line TG4 is stopped. This starts an exposure period and accumulates charges generated through photoelectric conversion in the photoelectric conversion units 101 and 102.

At T14, an ON signal is applied to the signal line SEL. The application of the ON signal to the signal line SEL continues until the pixel 100 outputs an image signal.

At T15, an ON signal is applied to the signal line RST, and the charge holding unit 109 is reset. At T15, the exposure period ends.

At T16, the application of the ON signal to the signal line RST is stopped.

At T17, an ON signal is applied to the signal lines TG1, TG2, TG3, and TG4. The charge transfer units 105 to 108 are conducted, and the charges accumulated in the photoelectric conversion units 101 to 104 are transferred to the charge holding unit 109 (collective transfer).

At T18, the application of the ON signal to the signal lines TG1, TG2, TG3, and TG4 is stopped. After that, an image signal c corresponding to the charges of the charge holding unit 109 is output from the signal line VO.

In this manner, the imaging element 1 according to the first embodiment of the present disclosure includes the photoelectric conversion unit connecting unit 110 in the pixel 100 and connects the photoelectric conversion units 101 to 104 to each other. This can prevent charge overflow even when some of the photoelectric conversion units 101 to 104 reach the saturation charge amount and can maintain the linearity of image signals with respect to the amount of incident light.

2. Second Embodiment

The imaging element 1 of the first embodiment described above includes the image signal generating unit 120 for each pixel 100. The imaging element 1 according to a second embodiment of the present disclosure is different from the above-described first embodiment in that a plurality of image signal generating units 120 are provided for each pixel 100.

[Configuration of Plane of Pixel]

Figure 7:
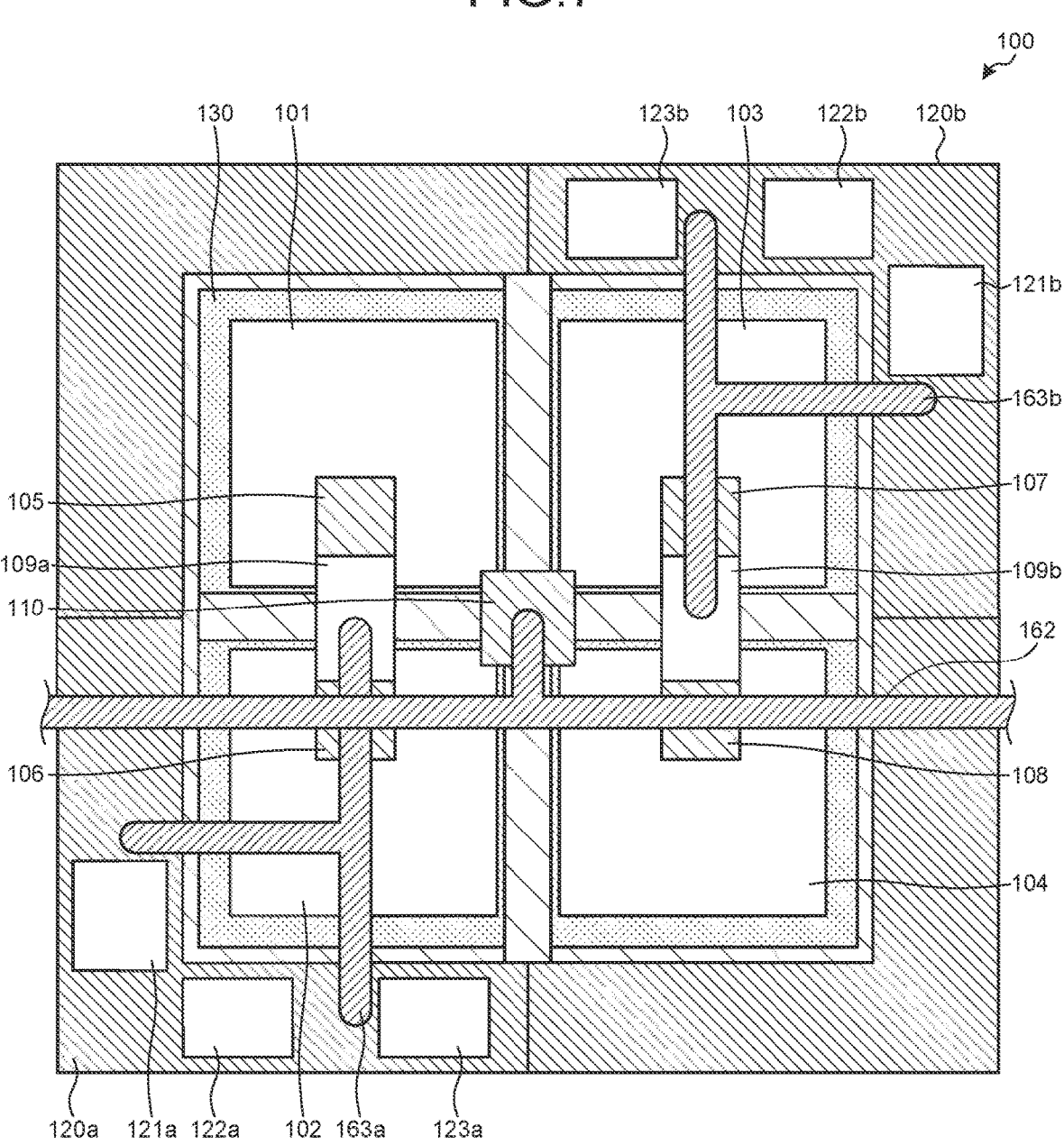
FIG. 7 is a plan view depicting a configuration example of a pixel according to a second embodiment of the present disclosure.

FIG. 7 is a plan view depicting a configuration example of a pixel according to the second embodiment of the present disclosure. This drawing is a plan view depicting a configuration example of the pixel 100 similarly to FIG. 3. The pixel 100 in the drawing is different from the pixel 100 in FIG. 3 in including two image signal generating units 120.

The pixel 100 in the drawing includes image signal generating units 120a and 120b. The image signal generating unit 120a includes a reset transistor 121a, an amplification transistor 122a, and a selection transistor 123a, and it is disposed adjacent to the lower left of the pixel 100 in the drawing. The image signal generating unit 120a is connected to the charge holding unit 109a via a wiring 163a. The image signal generating unit 120b includes a reset transistor 121b, an amplification transistor 122b, and a selection transistor 123b, and it is disposed adjacent to the upper right of the pixel 100 in the drawing. The image signal generating unit 120b is connected to the charge holding unit 109b via a wiring 163b.

Since the image signal generating units 120a and 120b are disposed in the charge holding units 109a and 109b, respectively, it is possible to simultaneously generate image signals based on the charges held in the charge holding units 109a and 109b. When an image signal is generated through individual transfer or when a phase difference signal is generated by dividing the photoelectric conversion units into the photoelectric conversion units 101 and 102 and the photoelectric conversion units 103 and 104, the time required for signal generation can be shortened.

The configuration of the imaging element 1 other than this is the same as the configuration of the imaging element 1 in the first embodiment of the present disclosure, and thus description thereof is omitted.

In this manner, the imaging element 1 according to the second embodiment of the present disclosure includes a plurality of image signal generating units 120. This can shorten the time for generating an image signal or the like.

3. Third Embodiment

In the imaging element 1 of the first embodiment described above, the image signal generating unit 120 is divided and disposed on the upper side and the lower side of the pixel 100. The imaging element 1 according to a third embodiment of the present disclosure is different from the above-described first embodiment in that the image signal generating unit 120 is disposed along two adjacent sides of the pixel 100.

[Configuration of Plane of Pixel]

Figure 8:
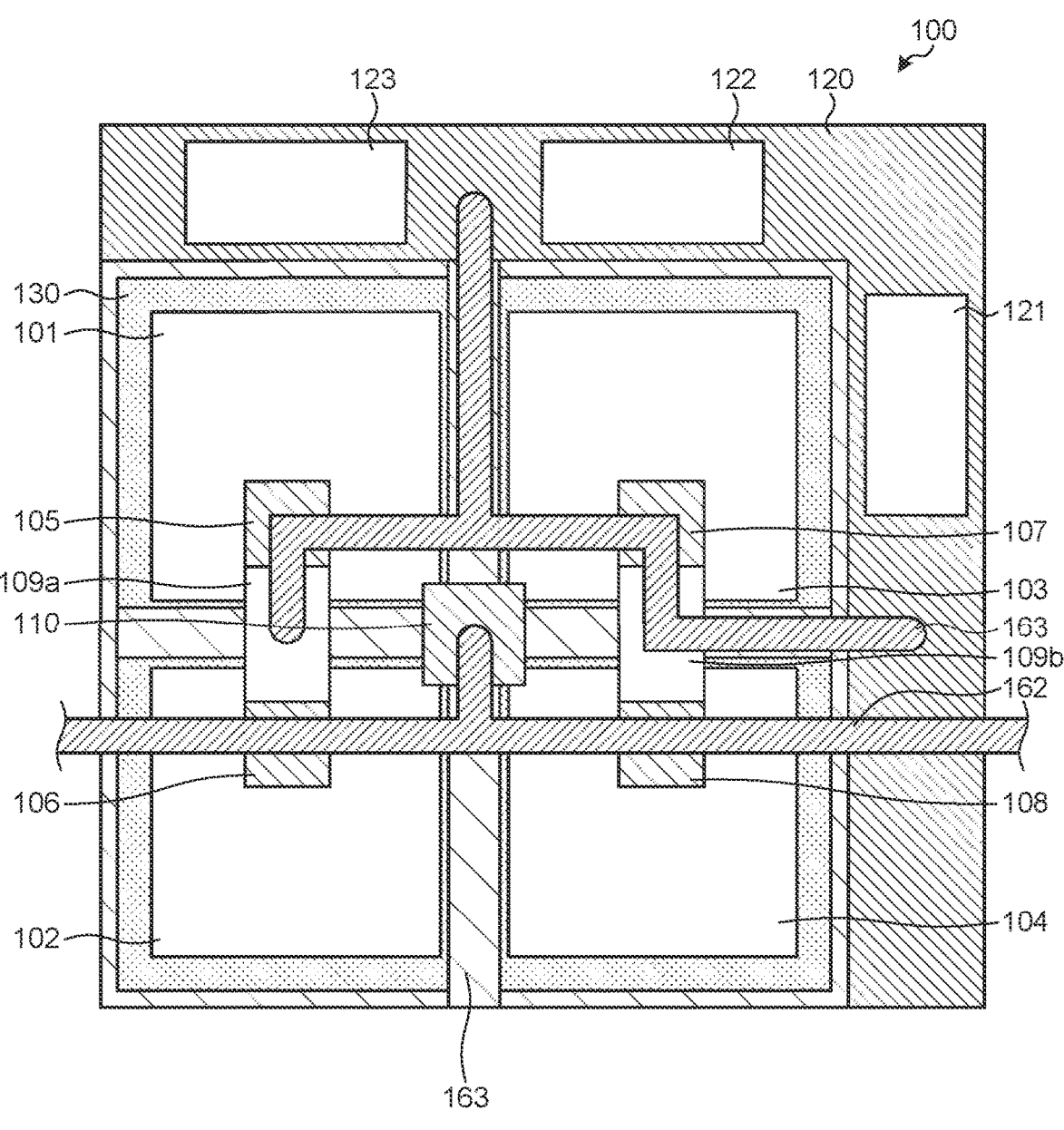
FIG. 8 is a plan view depicting a configuration example of a pixel according to a third embodiment of the present disclosure.

FIG. 8 is a plan view depicting a configuration example of a pixel according to the third embodiment of the present disclosure. This drawing is a plan view depicting a configuration example of the pixel 100 similarly to FIG. 3. The pixel 100 in the drawing is different from the pixel 100 in FIG. 3 in that the image signal generating unit 120 is disposed along two adjacent sides of the pixel 100 of the pixel 100.

The image signal generating unit 120 in the drawing is disposed adjacent to the upper surface and the right side surface of the pixel 100 in the drawing. This configuration can shorten the length of the wiring 163 connected to the charge holding unit 109. For example, in the pixel 100 in the drawing, the length of the wiring 163 connecting the charge holding unit 109b and the reset transistor 121 is shortened. Since the length of the wiring 163 is shortened, the stray capacitance of the wiring 163 can be reduced. This makes it possible to prevent a decrease in sensitivity.

The configuration of the imaging element 1 other than this is the same as the configuration of the imaging element 1 in the first embodiment of the present disclosure, and thus description thereof is omitted.

In this manner, in the imaging element 1 according to the third embodiment of the present disclosure, since the image signal generating unit 120 is disposed at one place, the length of the wiring 163 connected to the charge holding unit 109 can be shortened. It is possible to prevent a decrease in sensitivity at the time of generating an image signal.

4. Fourth Embodiment

In the imaging element 1 of the first embodiment described above, the photoelectric conversion unit connecting unit 110 is disposed at the center of the pixel 100. The imaging element 1 according to a fourth embodiment of the present disclosure is different from the above-described first embodiment in that the charge holding unit 109 is disposed at the center of the pixel 100.

[Configuration of Plane of Pixel]

Figure 9:
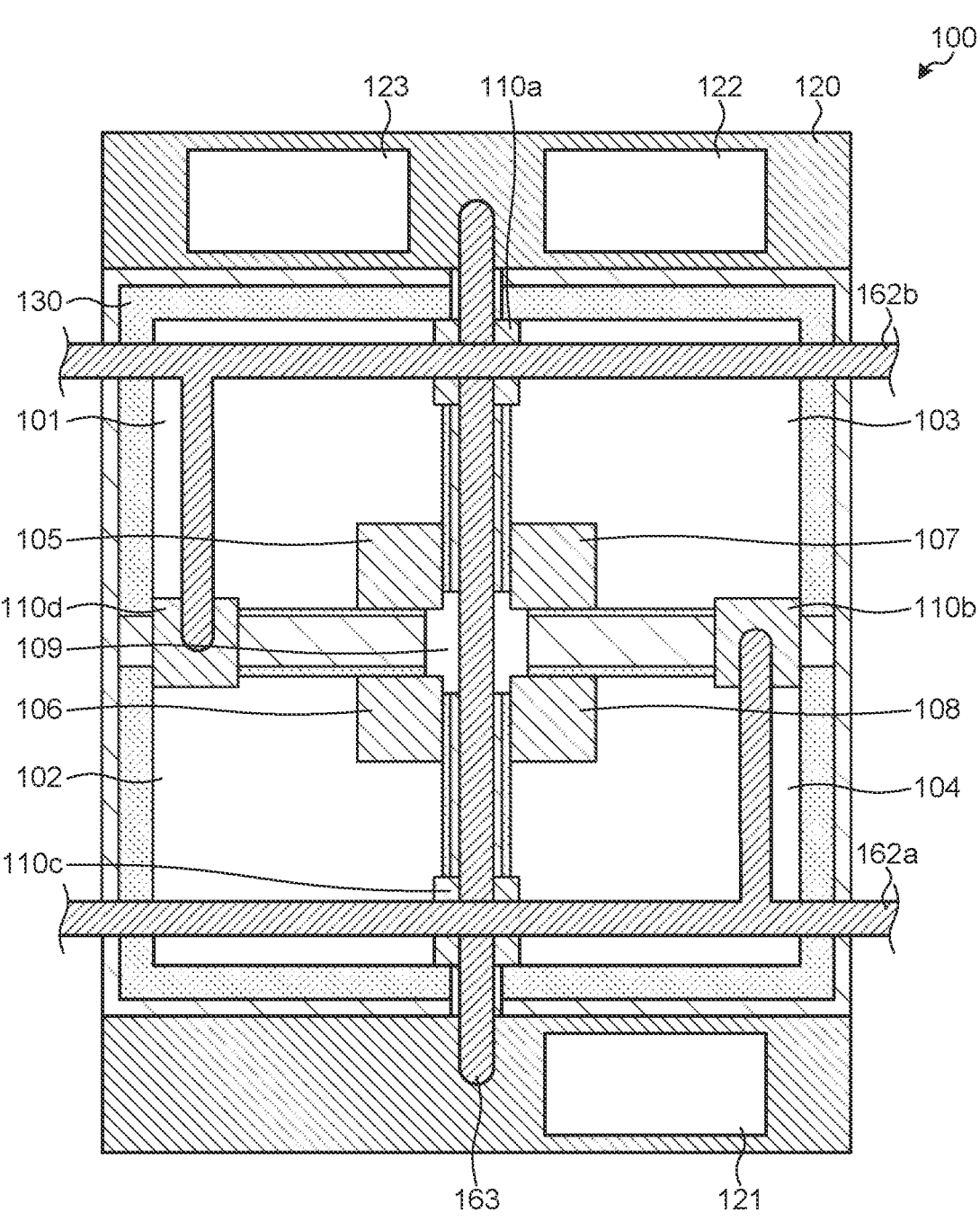
FIG. 9 is a plan view depicting a configuration example of a pixel according to a fourth embodiment of the present disclosure.

FIG. 9 is a plan view depicting a configuration example of a pixel according to the fourth embodiment of the present disclosure. This drawing is a plan view depicting a configuration example of the pixel 100 similarly to FIG. 3. The pixel 100 in the drawing is different from the pixel 100 in FIG. 3 in that the charge holding unit 109 is disposed in the central part of the pixel 100, and the photoelectric conversion unit connecting unit 110 divided into four is disposed between the photoelectric conversion units.

In the pixel 100 in the drawing, a single charge holding unit 109 is disposed in the central part of the pixel 100. The charge transfer units 105 to 108 are disposed adjacent to the charge holding unit 109. The wiring 163 is connected to the charge holding unit 109. Since the wiring 163 is wired to the single charge holding unit 109, the length of the wiring can be shortened.

The pixel 100 in the drawing includes photoelectric conversion unit connecting units 110*a*, 110*b*, 110*c*, and 110*d*. The photoelectric conversion unit connecting unit 110*a* is disposed between the photoelectric conversion units 101 and 103, and it connects the photoelectric conversion units 101 and 103. The photoelectric conversion unit connecting unit 110*b* is disposed between the photoelectric conversion units 103 and 104, and it connects the photoelectric conversion units 103 and 104. The photoelectric conversion unit connecting unit 110*c* is disposed between the photoelectric conversion units 104 and 102, and it connects the photoelectric conversion units 104 and 102. The photoelectric conversion unit connecting unit 110*d* is disposed between the photoelectric conversion units 102 and 101, and it connects the photoelectric conversion units 102 and 101.

Each of the photoelectric conversion unit connecting units 110*a*, 110*b*, 110*c*, and 110*d* includes the gate electrode 153 (illustrated). The photoelectric conversion units 101 to 104 can be connected to each other by applying an ON signal to these gate electrodes 153 to electrically conduct the photoelectric conversion unit connecting units 110*a*, 110*b*, 110*c*, and 110*d*. A wiring 162*b* is connected to the photoelectric conversion unit connecting units 110*a* and 110*d*. A wiring 162*a* is connected to the photoelectric conversion unit connecting units 110*b* and 110*c*.

[Another Configuration of Plane of Pixel]

Figure 10:
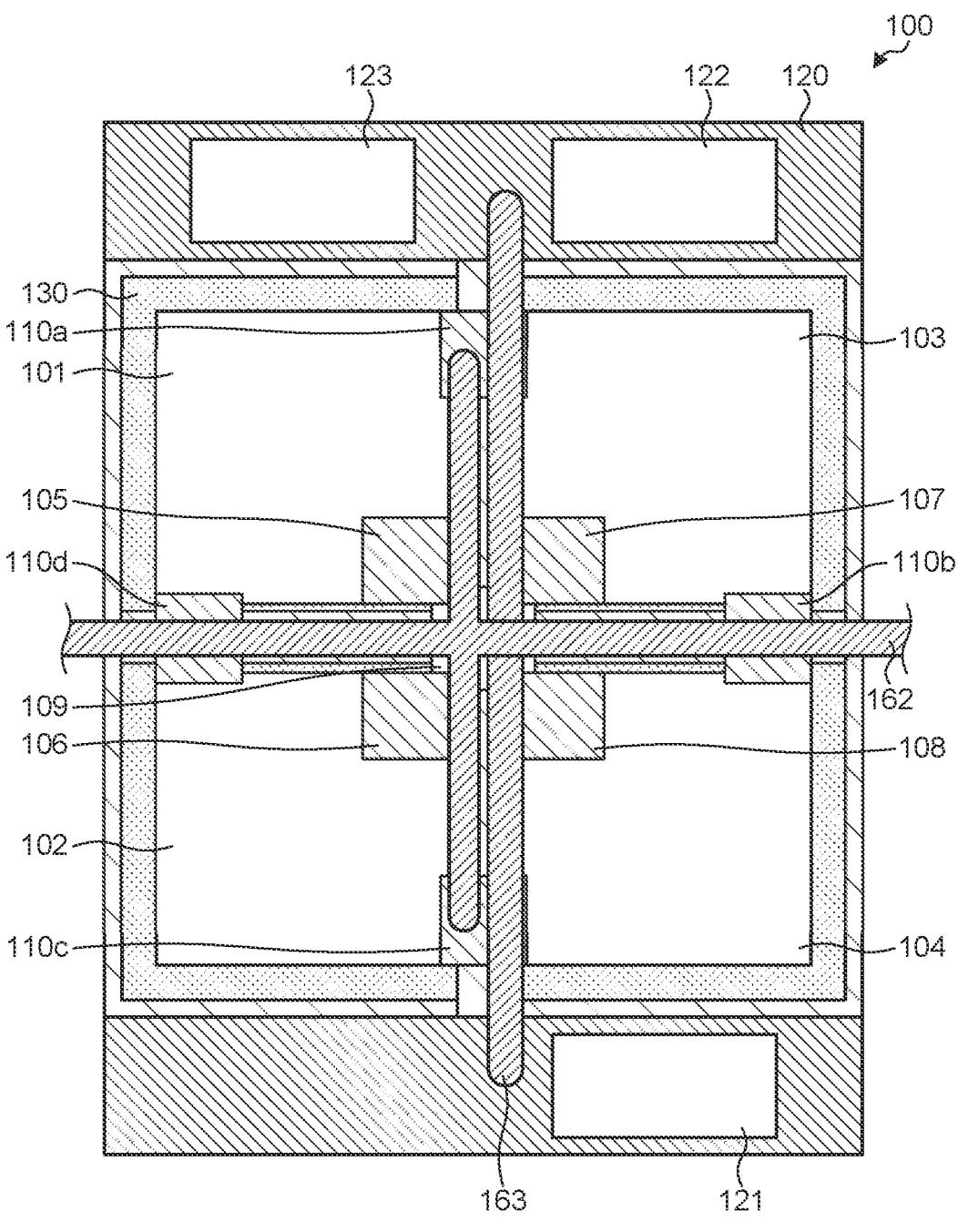
FIG. 10 is a plan view depicting another configuration example of the pixel according to the fourth embodiment of the present disclosure.

FIG. 10 is a plan view depicting another configuration example of the pixel according to the fourth embodiment of the present disclosure. The drawing is a sectional view depicting a configuration example of the pixel 100 similarly to FIG. 9. The photoelectric conversion unit connecting units 110*a* to 110*d* in the drawing are different from those in the pixel 100 in FIG. 9 in that they are connected by a single wiring 162.

The configuration of the imaging element 1 other than this is the same as the configuration of the imaging element 1 in the first embodiment of the present disclosure, and thus description thereof is omitted.

In this manner, since the single charge holding unit 109 is disposed in the central part of the pixel 100 in the imaging element 1 according to the fourth embodiment of the present disclosure, the length of the wiring 163 connected to the charge holding unit 109 can be shortened. It is possible to prevent a decrease in sensitivity at the time of generating an image signal.

5. Fifth Embodiment

In the imaging element 1 of the first embodiment described above, the pixel isolation unit 171 is disposed at the boundary of the pixel 100. The imaging element 1 according to a fifth embodiment of the present disclosure is different from the above-described first embodiment in that a pixel isolation unit 173 having a shape penetrating the semiconductor substrate 130 is disposed at the boundary of the pixel 100.

[Configuration of Section of Pixel]

Figure 11:
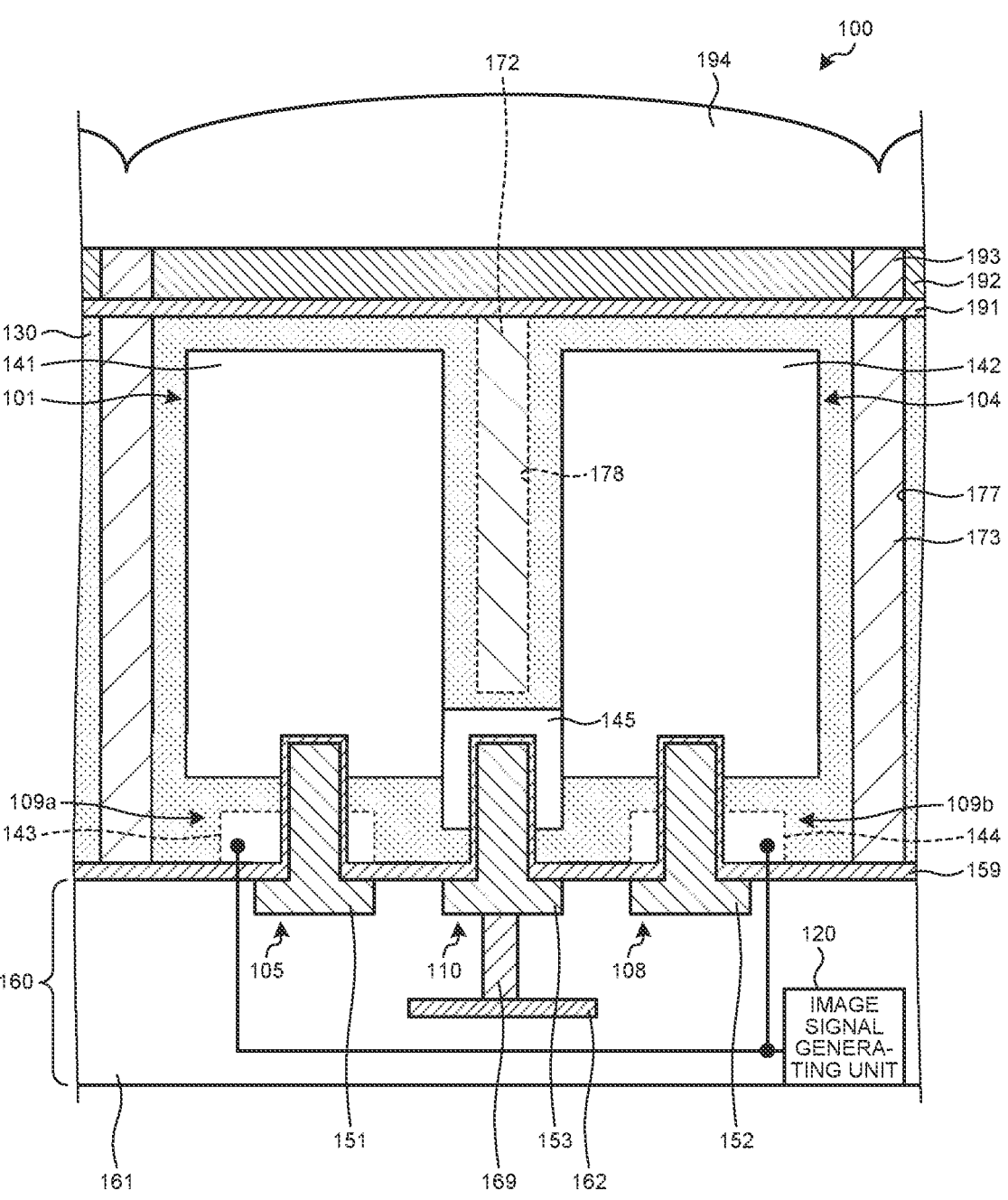
FIG. 11 is a sectional view depicting a configuration example of a pixel according to a fifth embodiment of the present disclosure.

FIG. 11 is a sectional view depicting a configuration example of a pixel according to the fifth embodiment of the present disclosure. This drawing is a sectional view depicting a configuration example of the pixel 100 similarly to FIG. 4. The pixel 100 in the drawing is different from the pixel 100 in FIG. 4 in including the pixel isolation unit 173 instead of the pixel isolation unit 171.

The pixel isolation unit 173 is an isolation unit formed in a shape penetrating the semiconductor substrate 130. The pixel isolation unit 173 may be configured by embedding an insulating member in a groove 177 having a shape penetrating the semiconductor substrate 130. The groove 177 is a groove formed from the front surface side of the semiconductor substrate 130.

The configuration of the imaging element 1 other than this is the same as the configuration of the imaging element 1 in the first embodiment of the present disclosure, and thus description thereof is omitted.

In this manner, in the imaging element 1 according to the fifth embodiment of the present disclosure, the pixel isolation unit 173 having a shape penetrating the semiconductor substrate 130 is disposed at the boundary of the pixel 100. This configuration can improve the isolation property of the pixel 100.

6. Sixth Embodiment

In the imaging element 1 of the first embodiment described above, the photoelectric conversion unit connecting unit 110 is disposed on the front surface side of the pixel 100. The imaging element 1 according to a sixth embodiment of the present disclosure is different from the above-described first embodiment in that a photoelectric conversion unit connecting unit is disposed on the back surface side of a pixel 100.

[Configuration of Section of Pixel]

Figure 12:
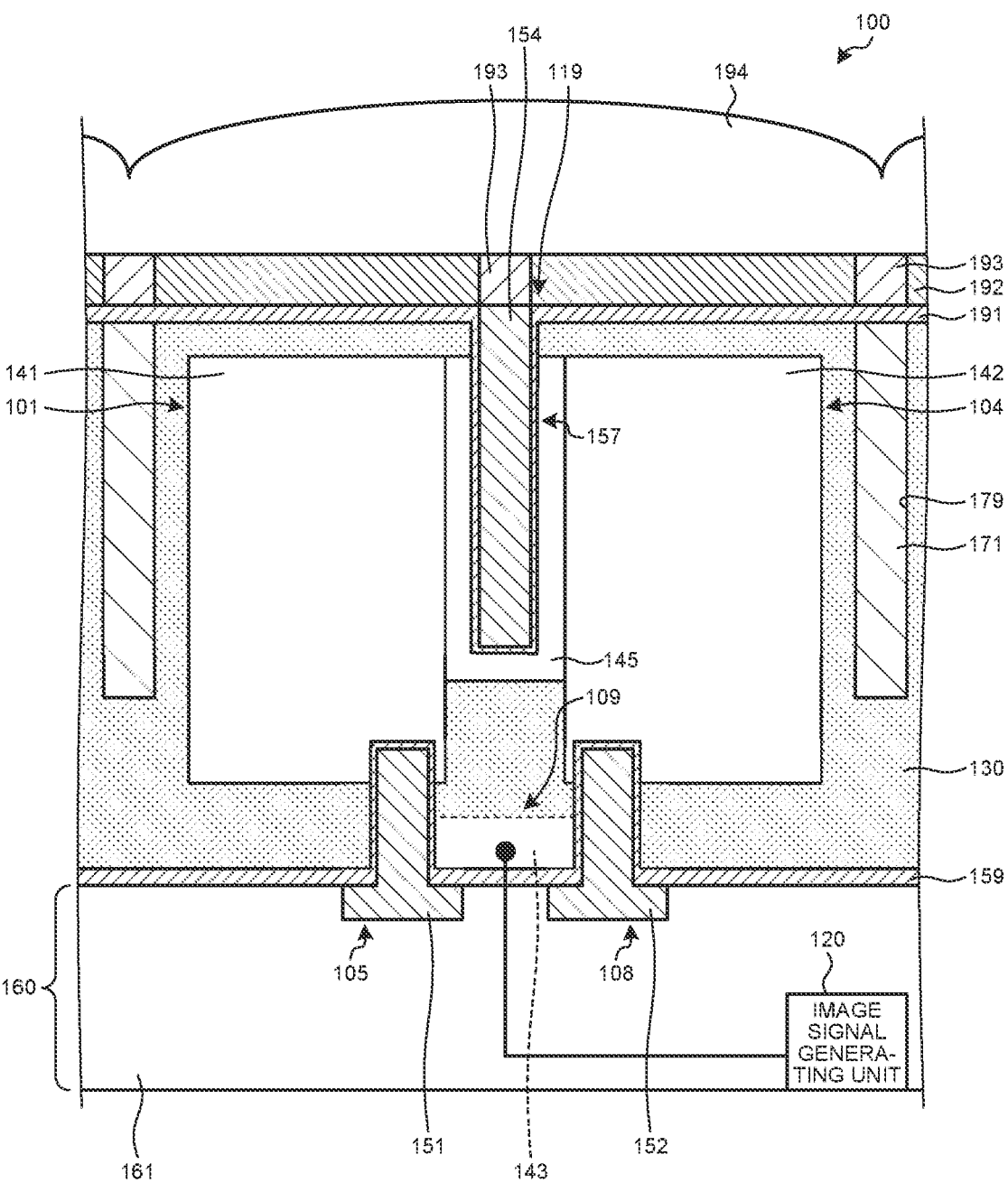
FIG. 12 is a sectional view depicting a configuration example of a pixel according to a sixth embodiment of the present disclosure.

FIG. 12 is a sectional view illustrating a configuration example of the pixel according to the sixth embodiment of the present disclosure. This drawing is a sectional view depicting a configuration example of the pixel 100 similarly to FIG. 4. The pixel 100 in the drawing is different from the pixel 100 in FIG. 4 in that a photoelectric conversion unit connecting unit 119 is disposed instead of the photoelectric conversion unit connecting unit 110, and the charge holding unit 109 is disposed at the center on the front surface side of the semiconductor substrate 130.

The photoelectric conversion unit connecting unit 119 is disposed on the back surface side of the semiconductor substrate 130. The semiconductor region 145 in the drawing is disposed on the back surface side of the semiconductor substrate 130. The photoelectric conversion unit connecting unit 119 in the drawing includes a gate electrode 154. The gate electrode 154 may be formed by embedding a conductive member such as polycrystalline silicon in a groove 157 formed from the back surface side of the semiconductor substrate 130. Forming the groove 157 having the same depth as the groove 178 in FIG. 4 can expand the gate electrode 154 in the thickness direction of the semiconductor substrate 130. The semiconductor region 145 can be expanded, and the region of the photoelectric conversion unit connecting unit 119 can be widened.

The charge holding unit 109 in the drawing is formed of the semiconductor region 143 disposed on the front surface side of the semiconductor substrate 130. The semiconductor region 143 is disposed adjacent to the gate electrodes 151 and 152 of the charge transfer units 105 and 108. Disposing the charge holding unit 109 commonly connected to the charge transfer units 105 to 108 at a position overlapping the photoelectric conversion unit connecting unit 110 on the front surface side of the semiconductor substrate 130 in this manner can reduce the number of elements disposed on the front surface side of the semiconductor substrate 130. The configuration of the wiring of the wiring region 160 can be simplified.

On the other hand, since the photoelectric conversion unit connecting unit 119 is disposed on the back surface side of the semiconductor substrate 130, the wiring of the gate electrode 154 of the photoelectric conversion unit connecting unit 119 is required on the back surface side of the semiconductor substrate 130. This wiring may be performed by the light shielding film 193. The light shielding film 193 in the drawing is also disposed at a position adjacent to the gate electrode 154 of the photoelectric conversion unit connecting unit 110. As described above, the light shielding film 193 may be made of tungsten. That is, since the light shielding film 193 is formed of a conductor, the light shielding film 193 can be used as the signal line SC described in FIG. 2.

[Configuration of Plane of Pixel]

FIGS. 13A to 13D are plan views depicting configuration examples of the pixel according to the sixth embodiment of the present disclosure. FIGS. 13A to 13D are plan views depicting configuration examples of the back surface side of the pixel 100.

FIG. 13A is a diagram depicting an example in which the light shielding film 193 is disposed at the boundary of the pixel 100 and is further disposed in the region of the boundary of the photoelectric conversion units 101 to 104. The light shielding film 193 disposed in the region of the boundary of the photoelectric conversion units 101 to 104 can be connected to the gate electrode 154 described above.

FIG. 13B is a diagram depicting an example in which the number of the light shielding film 193 disposed in the region of the boundary of the photoelectric conversion units 101 to 104 is reduced to one. The area of the light shielding film 193 disposed on the back surface side of the semiconductor substrate 130 can be reduced, and a decrease in the amount of incident light to the pixel 100 can be reduced.

FIG. 13C is a diagram depicting an example in which the light shielding film 193 at the boundary of the pixel 100 and the photoelectric conversion unit connecting unit 119 are connected by a wiring 182 formed of a transparent conductive film. Since the wiring is performed by a transparent conductive film, it is possible to further reduce a decrease in the amount of incident light to the pixel 100.

FIG. 13D is a diagram depicting an example in which the number of wiring 182 disposed in the region of the boundary of the photoelectric conversion units 101 to 104 is reduced to one. This configuration can further reduce a decrease in the amount of incident light to the pixel 100.

The light shielding film 193 in the drawing may be connected to the wiring 162 of the wiring region 160 with a through via penetrating the semiconductor substrate 130. The through via may be disposed in a region outside the pixel region 3 described in FIG. 1.

The configuration of the imaging element 1 other than this is the same as the configuration of the imaging element 1 in the first embodiment of the present disclosure, and thus description thereof is omitted.

The imaging element 1 according to the sixth embodiment of the present disclosure can widen the region of the photoelectric conversion unit connecting unit 119 by disposing the photoelectric conversion unit connecting unit 119 on the back surface side of the semiconductor substrate 130 in this manner. In addition, the disposition of elements on the front surface side of the semiconductor substrate 130 and the configuration of the wiring of the wiring region 160 can be simplified.

7. Seventh Embodiment

In the imaging element 1 of the first embodiment described above, the photoelectric conversion unit connecting unit 110 is disposed on the front surface side of the pixel 100. The imaging element 1 according to a seventh embodiment of the present disclosure is different from the above-described first embodiment in that the photoelectric conversion unit connecting unit 119 is further disposed on the back surface side of the pixel 100.

[Configuration of Section of Pixel]

FIG. 14 is a sectional view depicting a configuration example of the pixel according to the seventh embodiment of the present disclosure. This drawing is a sectional view depicting a configuration example of the pixel 100 similarly to FIG. 4. The pixel 100 in the drawing is different from the pixel 100 in FIG. 4 in that the photoelectric conversion unit connecting unit 119 described in FIG. 12 is further disposed, and the semiconductor region 145 is disposed in common for the photoelectric conversion unit connecting units 110 and 119.

The semiconductor region 145 in the drawing is configured to have a shape extending from the vicinity of the front surface side to the back surface side of the semiconductor substrate 130. The semiconductor region 145 can be further expanded, and the region of the photoelectric conversion unit connecting unit 119 can be widened.

The configuration of the imaging element 1 other than this is the same as the configuration of the imaging element 1 in the first embodiment of the present disclosure, and thus description thereof is omitted.

The imaging element 1 according to the seventh embodiment of the present disclosure can widen the region of the photoelectric conversion unit connecting unit 119 by disposing the photoelectric conversion unit connecting units 119 and 110 on both surfaces of the semiconductor substrate 130 in this manner.

8. Configuration Example of Imaging Device

The imaging element 1 as described above may be applied to various electronic devices such as an imaging system, for example, a digital still camera or a digital video camera, a mobile phone having an imaging function, or another device having an imaging function, for example.

FIG. 15 is a block diagram depicting a configuration example of an imaging device mounted on an electronic device.

As illustrated in FIG. 15, an imaging device 701 includes an optical system 702, an imaging element 703, and a digital signal processor (DSP) 704. The imaging device 701 is configured by connecting the DSP 704, a display device 705, an operation system 706, a memory 708, a recording device 709, and a power supply system 710 via a bus 707 and is capable of capturing a still image and a moving image.

The optical system 702 includes one or a plurality of lenses, guides image light (incident light) from an object to the imaging element 703, and forms an image on a light receiving surface (sensor unit) of the imaging element 703.

As the imaging element 703, the imaging element 1 of any of the configuration examples described above is applied. In the imaging element 703, electrons are accumulated for a certain period according to an image formed on the light receiving surface via the optical system 702. Then, a signal corresponding to the electrons accumulated in the imaging element 703 is input to the DSP 704.

The DSP 704 performs various types of signal processing on the signal from the imaging element 703 to acquire an image and temporarily stores data of the image in the memory 708. The image data stored in the memory 708 is recorded in the recording device 709 or supplied to the display device 705 to display an image. The operation system 706 receives various operations by the user and supplies an operation signal to each block of the imaging device 701, and the power supply system 710 supplies power necessary for driving each block of the imaging device 701.

9. Application Example to Mobile Body

The technology according to the present disclosure (present technology) may be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a vessel, and a robot.

FIG. 16 is a block diagram depicting an example of schematic configuration of a vehicle control system as an example of a mobile body control system to which the technology according to an embodiment of the present disclosure can be applied.

A vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 16, an audio speaker 12061, a display section 12062, and an instrument panel 12063 are illustrated as the output device. The display section 12062 may, for example, include at least one of an on-board display and a head-up display.

FIG. 17 is a diagram depicting an example of the installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of a vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle.

For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to the present disclosure may be applied to the imaging section 12031 among the configurations described above. Specifically, the imaging element 1 in FIG. 1 may be applied to the imaging section 12031.

10. Application Example to Endoscopic Surgical System

The technology according to the present disclosure (present technology) may be applied to various products. For example, the technology according to the present disclosure may be applied to an endoscopic surgical system.

FIG. 18 is a view depicting an example of a schematic configuration of an endoscopic surgery system to which the technology according to an embodiment of the present disclosure (present technology) can be applied.

In FIG. 18, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 19 is a block diagram depicting an example of a functional configuration of the camera head 11102 and the CCU 11201 depicted in FIG. 18.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of PAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgical system to which the technology according to the present disclosure may be applied has been described above. The technology according to the present disclosure may be applied to the endoscope 11100 and the image pickup unit 11402 of the camera head 11102 among the above-described configurations. Specifically, the imaging element 1 in FIG. 1 may be applied to the image pickup unit 11402.

The endoscopic surgical system has been described here as an example, but the technology according to the present disclosure may be applied to, for example, a microscopic surgical system or the like.

The effects described in the present specification are merely examples and are not restrictive of the disclosure herein, and other effects may be achieved.

The present technology may also take the following configurations.

(1)

An imaging element comprising:

a pixel including a plurality of photoelectric conversion units formed on a semiconductor substrate, the semiconductor substrate including a wiring region disposed on a front surface side, the photoelectric conversion units performing photoelectric conversion of incident light from an object to generate charges;

a photoelectric conversion unit connecting unit that connects the plurality of photoelectric conversion units to each other;

a charge holding unit that holds the charges generated by the photoelectric conversion units;

a plurality of charge transfer units that are individually disposed for the plurality of photoelectric conversion units and transfer the charges generated by the photoelectric conversion units to the charge holding unit to cause the charge holding unit to hold the charges;

an image signal generating unit that generates an image signal based on the charges held by the charge holding unit; and an on-chip lens that is disposed in the pixel and collects the incident light to the plurality of photoelectric conversion units in common.

(2)

The imaging element according to the above (1), wherein the plurality of charge transfer units performs collective transfer of transferring the charges generated by the plurality of photoelectric conversion units to the charge holding unit in common and causing the charge holding unit to simultaneously and collectively hold the charges generated by the plurality of photoelectric conversion units, and individual transfer of individually transferring the charges generated by the plurality of photoelectric conversion units to the charge holding unit.

(3)

The imaging element according to the above (2), wherein the photoelectric conversion unit connecting unit connects the photoelectric conversion units to each other when charges to be transferred through the collective transfer is generated.

(4)

The imaging element according to any one of the above (1) to (3), wherein the plurality of charge transfer units divide the plurality of photoelectric conversion units into two groups and transfer charges for each of the groups to cause the charge holding unit to hold the charges, and the image signal generating unit further generates a phase difference signal for performing pupil division on an image of the object in a direction of the division based on charges held for each of the groups and detecting an image plane phase difference.

(5)

The imaging element according to any one of the above (1) to (4), wherein the photoelectric conversion unit connecting unit connects the photoelectric conversion units to each other by forming a channel in a semiconductor region adjacent to the plurality of photoelectric conversion units.

(6)

The imaging element according to the above (5), wherein the photoelectric conversion unit connecting unit includes a gate electrode that forms the channel.

(7)

The imaging element according to the above (6), wherein the photoelectric conversion unit connecting unit includes the gate electrode embedded in the semiconductor substrate.

(8)

The imaging element according to any one of the above (1) to (7), wherein the plurality of photoelectric conversion units are disposed in two rows and two columns.

(9)

The imaging element according to any one of the above (1) to (8), wherein the pixel is irradiated with the incident light on a back surface side of the semiconductor substrate.

(10)

The imaging element according to the above (9), wherein the photoelectric conversion unit connecting unit is disposed on the back surface side of the semiconductor substrate.

(11)

The imaging element according to the above (10), wherein the charge holding unit is disposed on a front surface side of the semiconductor substrate and is disposed at a position overlapping the photoelectric conversion unit connecting unit in plan view.

(12)

The imaging element according to any one of the above (1) to (11), further comprising an in-pixel isolation unit that isolates the plurality of photoelectric conversion units.

(13)

The imaging element according to any one of the above (1) to (12), further comprising a pixel isolation unit disposed at a boundary of the pixel.

(14)

The imaging element according to the above (13), wherein the pixel isolation unit is formed of an insulating member embedded in a groove formed in the semiconductor substrate.

(15)

An imaging device comprising:

a pixel including a plurality of photoelectric conversion units formed on a semiconductor substrate, the semiconductor substrate including a wiring region disposed on a front surface side, the photoelectric conversion units performing photoelectric conversion of incident light from an object to generate charges;

a photoelectric conversion unit connecting unit that connects the plurality of photoelectric conversion units to each other;

a charge holding unit that holds the charges generated by the photoelectric conversion units;

a plurality of charge transfer units that are individually disposed for the plurality of photoelectric conversion units and transfer the charges generated by the photoelectric conversion units to the charge holding unit to cause the charge holding unit to hold the charges;

an image signal generating unit that generates an image signal based on the charges held by the charge holding unit;

an on-chip lens that is disposed in the pixel and collects
the incident light to the plurality of photoelectric con-
version units in common; and
a processing circuit that processes the image signal gen-
erated by the image signal generating unit.

REFERENCE SIGNS LIST

1, 703 IMAGING ELEMENT
5 COLUMN SIGNAL PROCESSING CIRCUIT
100 PIXEL
101 to 104 PHOTOELECTRIC CONVERSION UNIT
105 to 108 CHARGE TRANSFER UNIT
109, 109a, 109b CHARGE HOLDING UNIT
110, 110a, 110b, 110c, 110d, 119 PHOTOELECTRIC
CONVERSION UNIT CONNECTING UNIT
120, 120a, 120b IMAGE SIGNAL GENERATING UNIT
130 SEMICONDUCTOR SUBSTRATE
141 to 145 SEMICONDUCTOR REGION
151 to 154 GATE ELECTRODE
160 WIRING REGION
162, 162b, 162a, 163, 163a, 163b, 182 WIRING
171, 173 PIXEL ISOLATION UNIT
172 IN-PIXEL ISOLATION UNIT
193 LIGHT SHIELDING FILM
194 ON-CHIP LENS
701 IMAGING DEVICE
11402, 12031, 12101 to 12105 IMAGE PICKUP UNIT/
IMAGING SECTION

The invention claimed is:

1. An imaging element comprising:
a pixel including a plurality of photoelectric conversion
units formed on a semiconductor substrate, the semi-
conductor substrate including a wiring region disposed
on a front surface side, the photoelectric conversion
units performing photoelectric conversion of incident
light from an object to generate charges;
a photoelectric conversion unit connecting circuit config-
ured to connect the plurality of photoelectric conver-
sion units to each other;
a charge holding unit that holds the charges generated by
the photoelectric conversion units;
a plurality of charge transfer transistors that are individu-
ally disposed for the plurality of photoelectric conver-
sion units and transfer the charges generated by the
photoelectric conversion units to the charge holding
unit to cause the charge holding unit to hold the
charges, wherein
the plurality of charge transfer transistors perform collec-
tive transfer of transferring the charges generated by
the plurality of photoelectric conversion units to the
charge holding unit in common, cause the charge
holding unit to simultaneously and collectively hold the
charges generated by the plurality of photoelectric
conversion units, and individually transfer the charges
generated by the plurality of photoelectric conversion
units to the charge holding unit, and
the photoelectric conversion unit connecting circuit is
configured to connect the photoelectric conversion
units to each other when charges to be transferred
through the collective transfer are generated;
an image signal generating unit that generates an image
signal based on the charges held by the charge holding
unit; and
an on-chip lens that is disposed in the pixel and collects
the incident light to the plurality of photoelectric con-
version units in common.

2. The imaging element according to claim 1, wherein
the plurality of charge transfer transistors divide the
plurality of photoelectric conversion units into two
groups and transfer charges for each of the groups to
cause the charge holding unit to hold the charges, and
the image signal generating unit further generates a phase
difference signal for performing pupil division on an
image of the object in a direction of the division based
on charges held for each of the groups and detecting an
image plane phase difference.

3. The imaging element according to claim 1, wherein the
photoelectric conversion unit connecting circuit is config-
ured to connect the photoelectric conversion units to each
other by forming a channel in a semiconductor region
adjacent to the plurality of photoelectric conversion units.

4. The imaging element according to claim 3, wherein the
photoelectric conversion unit connecting unit circuit
includes a gate electrode that forms the channel.

5. The imaging element according to claim 4, wherein the
photoelectric conversion unit connecting circuit includes the
gate electrode embedded in the semiconductor substrate.

6. The imaging element according to claim 1, wherein the
plurality of photoelectric conversion units are disposed in
two rows and two columns.

7. The imaging element according to claim 1, wherein the
pixel is irradiated with the incident light on a back surface
side of the semiconductor substrate.

8. The imaging element according to claim 7, wherein the
photoelectric conversion unit connecting circuit is disposed
on the back surface side of the semiconductor substrate.

9. The imaging element according to claim 8, wherein the
charge holding unit is disposed on a front surface side of the
semiconductor substrate and is disposed at a position over-
lapping the photoelectric conversion unit connecting circuit
in plan view.

10. The imaging element according to claim 1, further
comprising an in-pixel isolation unit that isolates the plu-
rality of photoelectric conversion units.

11. The imaging element according to claim 1, further
comprising a pixel isolation unit disposed at a boundary of
the pixel.

12. The imaging element according to claim 11, wherein
the pixel isolation unit is formed of an insulating member
embedded in a groove formed in the semiconductor sub-
strate.

13. An imaging device comprising:
a pixel including a plurality of photoelectric conversion
units formed on a semiconductor substrate, the semi-
conductor substrate including a wiring region disposed
on a front surface side, the photoelectric conversion
units performing photoelectric conversion of incident
light from an object to generate charges;
a photoelectric conversion unit connecting circuit config-
ured to connect the plurality of photoelectric conver-
sion units to each other;
a charge holding unit that holds the charges generated by
the photoelectric conversion units;
a plurality of charge transfer transistors that are individu-
ally disposed for the plurality of photoelectric conver-
sion units and transfer the charges generated by the
photoelectric conversion units to the charge holding
unit to cause the charge holding unit to hold the
charges, wherein
the plurality of charge transfer transistors perform collec-
tive transfer of transferring the charges generated by
the plurality of photoelectric conversion units to the
charge holding unit in common, cause the charge holding unit to simultaneously and collectively hold the charges generated by the plurality of photoelectric conversion units, and individually transfer the charges generated by the plurality of photoelectric conversion units to the charge holding unit, and the photoelectric conversion unit connecting circuit is configured to connect the photoelectric conversion units to each other when charges to be transferred through the collective transfer are generated;

an image signal generating unit that generates an image signal based on the charges held by the charge holding unit;

an on-chip lens that is disposed in the pixel and collects the incident light to the plurality of photoelectric conversion units in common; and a processing circuit that processes the image signal generated by the image signal generating unit.

14. The imaging device according to claim 13, wherein the plurality of charge transfer transistors divide the plurality of photoelectric conversion units into two groups and transfer charges for each of the groups to cause the charge holding unit to hold the charges, and the image signal generating unit further generates a phase difference signal for performing pupil division on an image of the object in a direction of the division based on charges held for each of the groups and detecting an image plane phase difference.

15. The imaging device according to claim 13, wherein the photoelectric conversion unit connecting circuit is configured to connect the photoelectric conversion units to each other by forming a channel in a semiconductor region adjacent to the plurality of photoelectric conversion units.

16. The imaging device according to claim 15, wherein the photoelectric conversion unit connecting circuit includes a gate electrode that forms the channel.

17. The imaging device according to claim 16, wherein the photoelectric conversion unit connecting circuit includes the gate electrode embedded in the semiconductor substrate.

18. The imaging device according to claim 13, wherein the plurality of photoelectric conversion units are disposed in two rows and two columns.

19. The imaging device according to claim 13, wherein the pixel is irradiated with the incident light on a back surface side of the semiconductor substrate.

20. The imaging device according to claim 19, wherein the photoelectric conversion unit connecting circuit is disposed on the back surface side of the semiconductor substrate.

* * * * *